United States Patent [19]
Otani et al.

[11] Patent Number: 5,220,715
[45] Date of Patent: Jun. 22, 1993

[54] PRINTED CIRCUIT BOARD PROCESSING APPARATUS

[75] Inventors: Tamio Otani, Hadano; Kunio Saitou, Yokohama; Yasuhiko Kanaya, Machida, all of Japan

[73] Assignee: Hitachi Seiko, Ltd., Japan

[21] Appl. No.: 820,606

[22] PCT Filed: May 23, 1991

[86] PCT No.: PCT/JP91/00686
    § 371 Date: Mar. 13, 1992
    § 102(e) Date: Mar. 13, 1992

[87] PCT Pub. No.: WO91/17862
    PCT Pub. Date: Nov. 28, 1991

[30] Foreign Application Priority Data

May 23, 1990 [JP] Japan .................. 2-131309

[51] Int. Cl.$^5$ .................. B23Q 7/14; B65G 47/00
[52] U.S. Cl. .................. 29/33 P; 198/341
[58] Field of Search .............. 29/33 P, 33 M, 564.1, 29/741, 742, 842, 846, 563, 564; 198/797, 346.1, 345.3, 341, 343.1; 414/225, 224; 408/69

[56] References Cited

U.S. PATENT DOCUMENTS

5,109,584  5/1992  Irie .................. 29/33 P

FOREIGN PATENT DOCUMENTS

| | | |
|---|---|---|
| 59-227616 | 12/1984 | Japan . |
| 60-29167 | 2/1985 | Japan . |
| 60-259351 | 12/1985 | Japan . |
| 60-263639 | 12/1985 | Japan . |
| 61-244441 | 10/1986 | Japan . |
| 284353 | 12/1986 | Japan .................. 414/225 |
| 284354 | 12/1986 | Japan .................. 414/225 |
| 62-297042 | 12/1987 | Japan . |
| 63-47037 | 2/1988 | Japan . |
| 63-295148 | 12/1988 | Japan . |

*Primary Examiner*—William Briggs
*Attorney, Agent, or Firm*—Evenson, McKeown, Edwards & Lenahan

[57] ABSTRACT

A printed circuit board processing apparatus includes: a plurality of printed circuit board processing machines (A) arranged side by side, in each of which a printed circuit board (W) placed on a table (4) and a tool held by a single spindle (13) are caused to make a relative movement in the X-, Y- and Z-directions of the machine to process the printed circuit board (W); tipping devices (B) respectively mounted on the tables (4) in such a manner as to be swingable and adapted to perform the delivery of printed circuit boards (W); conveying devices (C) arranged along the beds (1) of the printed circuit board processing machines (A) and each equipped with a feeding path (C1) and a discharging path (C2) which are adapted to convey printed circuit boards (W) in an inclined posture; loading/unloading devices (D) arranged at a delivery position on the printed-circuit-board-processing-machine side of the feeding and discharging paths of the conveying devices (C) and adapted to effect the delivery of printed circuit boards between the tipping device (B) and the paths; a printed-circuit-board feeder (E) connected to one end of each feeding path (C1); a printed circuit board collecting device (F) connected to one end of each discharging path (C2); and detectors (G) allocated to the respective spindles (13) of the printed circuit board processing machines (A) and each adapted to read the kind of a printed circuit boards (W) fed onto the associated table (4).

6 Claims, 24 Drawing Sheets

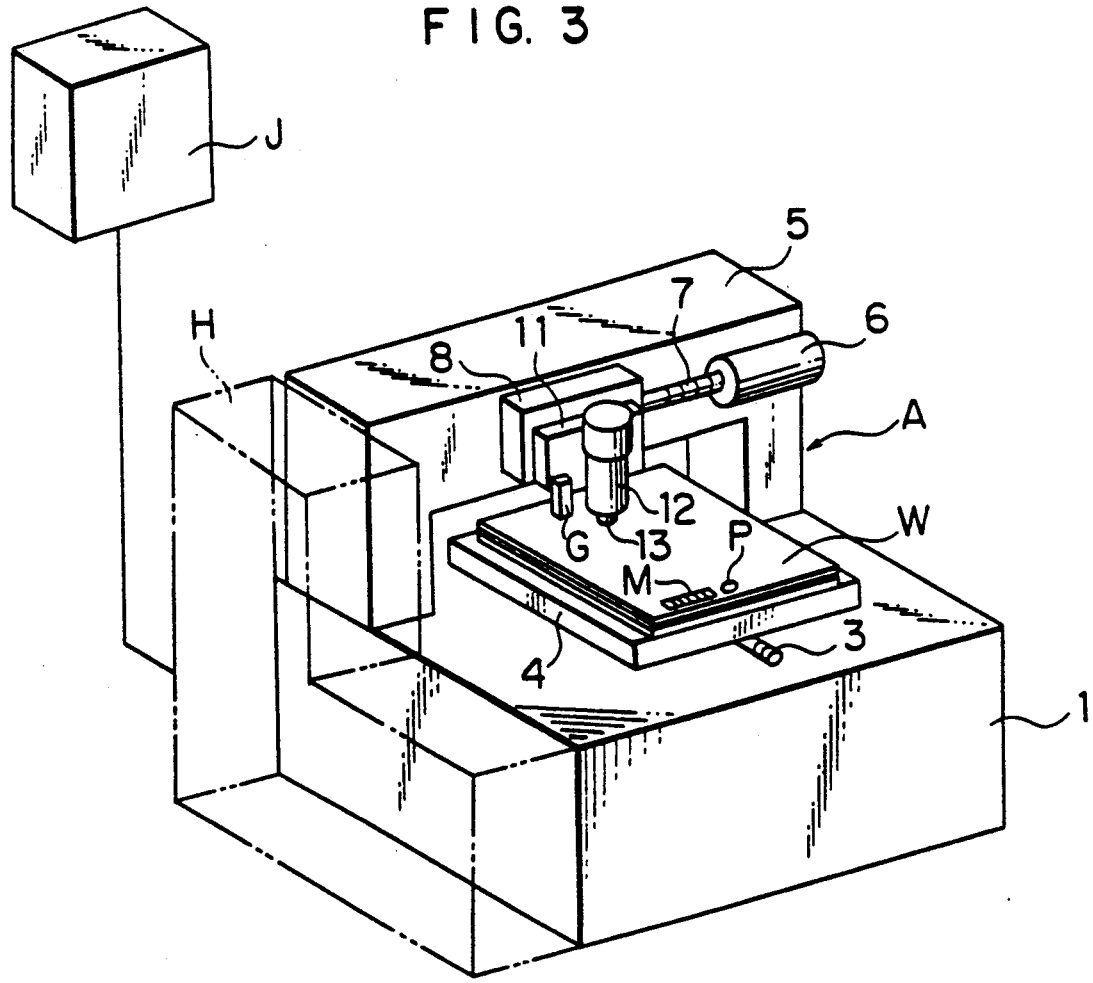

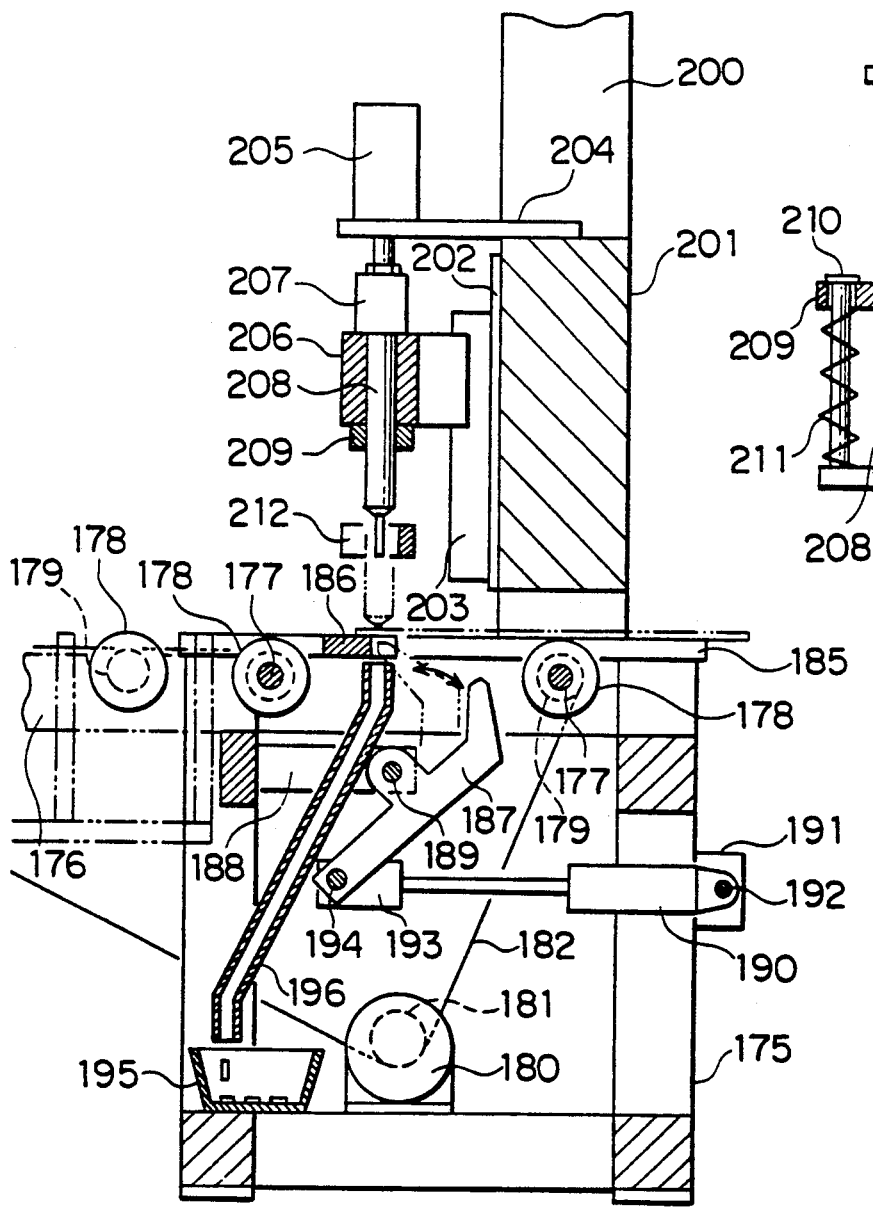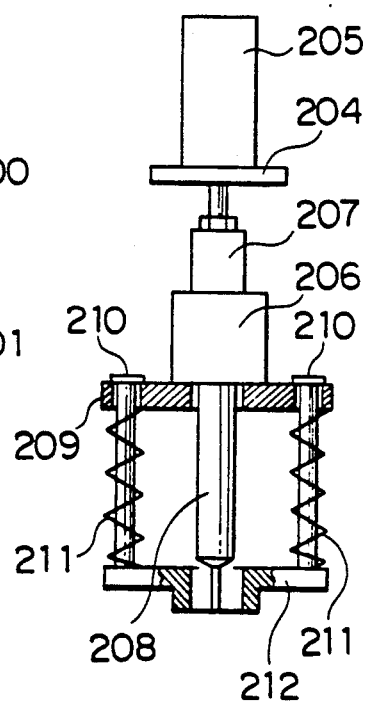
FIG. 22
FIG. 23

F I G. 25
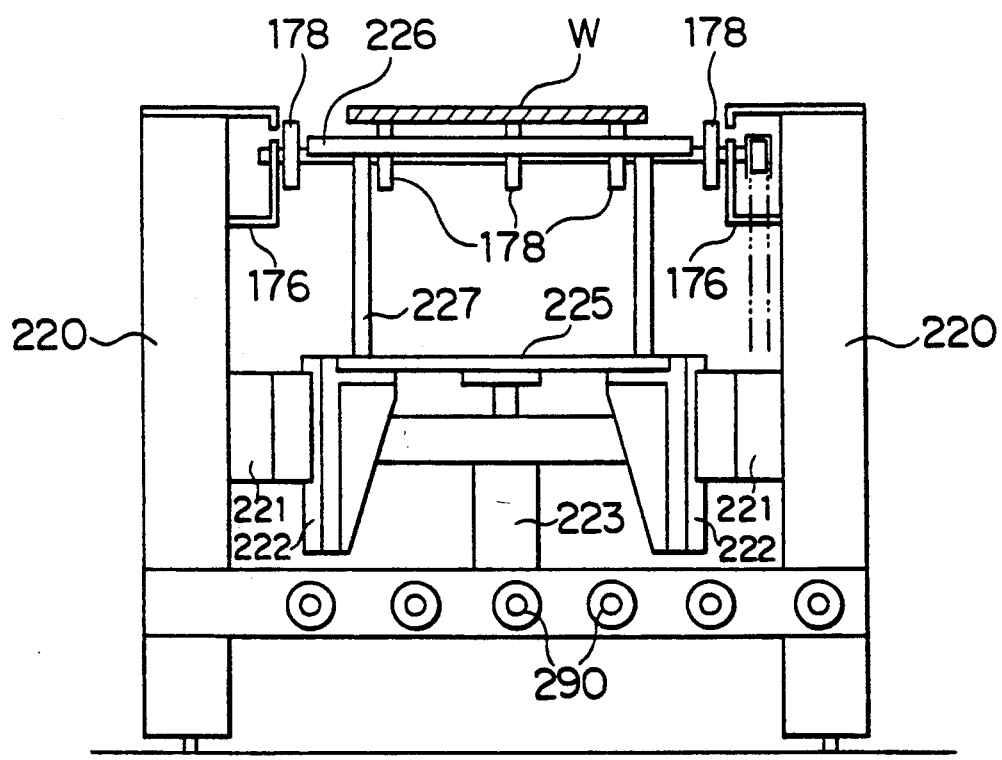

PRINTED CIRCUIT BOARD PROCESSING APPARATUS

DESCRIPTION

1. Technical Field

This invention relates to a printed circuit board processing apparatus and, in particular, to a printed circuit board processing apparatus which is suitable for automatizing the processing of various kinds of printed circuit boards in small quantities.

2. Background Art

Examples of a printed circuit board processing machine equipped with an automatic printed circuit board feeder are disclosed in Japanese Patent Laid-Open Publications No. 59-227616, 60-259351, 61-244441, 62-297042, 63-47037, 63-295148, etc.

Further, Japanese Patent Laid-Open Publication No. 60-263639 discloses an example of a printed circuit board feeder in which printed circuit boards are fed in an inclined posture.

The above printed circuit board processing machines are intended for the processing of limited kinds of printed circuit boards in large quantities. Thus, one printed circuit board processing machine is generally equipped with four to six spindles, processing four to six printed circuit boards at one time.

In such a printed circuit board processing machine, the printed circuit boards to be processed are placed on a single table, and all the spindles move simultaneously in the same direction, whereby it is possible to process printed circuit boards of the same kind efficiently at the same time.

On the other hand, it may happen that the number of printed circuits boards processed at one time is less than the number of spindles, which is the case when processing various types of printed circuit boards in small quantities, or odd pieces in mass production. In such a case, some of the spindles remain unused, with the result that the printed circuit board processing machine deteriorates in operation rate.

DISCLOSURE OF THE INVENTION

In view of the above problem, it is an object of this invention to provide a printed circuit board processing machine which makes it possible to process various kinds of printed circuit boards in small quantities at a high level of efficiency.

To achieve the above object, this invention provides a printed circuit board processing apparatus comprising: a plurality of printed circuit board processing machines arranged side by side, in each of which a printed circuit board placed on a table and a tool held by a single spindle are caused to make a relative movement in the X-, Y- and Z-directions of the machine to process the printed circuit board; tipping devices respectively mounted on the tables in such a manner as to be swingable and adapted to perform the delivery of printed circuit boards; conveying devices respectively arranged along the respective beds of the printed circuit board processing machines and each equipped with a feeding path and a discharging path which are adapted to convey printed circuit boards in an inclined posture; loading/unloading devices each arranged at a delivery position on the printed-circuit-board-processing-machine side of the feeding and discharging paths of each conveying device and adapted to effect the delivery of printed circuit boards between the associated tipping device and these paths; a printed-circuit-board feeder connected to one end of each feeding path; a printed circuit board collecting device connected to one end of each discharging path; and detectors allocated to the respective spindles of the printed circuit board processing machines and each adapted to read the kind of a printed circuit board fed onto the table associated therewith.

Before the processing of a printed circuit board has been completed by a printed circuit board processing machine, a next printed circuit board to be processed is sent out from the printed circuit board feeder and conveyed by the conveying devices to the feeding position of that printed circuit board processing machine. And when the processing of the first printed circuit board has been completed by this printed circuit board processing machine, the table of this machine moves to a printed circuit board discharging position, when the tipping device operates to raise the printed circuit board from the table, making it stand on end. And when the printed circuit board has been delivered from the tipping device to the loading/unloading device, the latter descends to discharge the processed printed circuit board onto the discharging path. Meanwhile, the table moves to a feeding position, when that part of the loading/unloading device which is on the side of the feeding path brings the next printed circuit board, which has been on standby in the feeding path, to the delivery position. And when this printed circuit board has been delivered from the loading/unloading device to the tipping device, the latter operates to place the printed circuit board on the table, which moves to a processing start position. At the same time, that part of the loading/unloading device which is on the feeding side descends. In the meantime, the processed printed circuit board which has been discharged onto the discharging path is carried to the printed circuit board collecting device, which takes it up. When the table supplied with the next printed circuit board reaches a processing start position, the detector reads an identification mark provided on the printed circuit board. And, in accordance with a processing program corresponding to the mark thus read, the printed circuit board processing machine is driven to perform the requisite processing operation.

BRIEF DESCRIPTION OF THE DRAWINGS

FIG. 2 is a perspective view of a workpiece;

FIG. 3 is a perspective view of a printed circuit board processing machine;;

FIG. 22 is a side sectional view of a pin extractor;

FIG. 23 is a front view of a pin extraction mechanism;

FIG. 25 is a rear view of the lifter portion of the second collecting device;

BEST MODE FOR CARRYING OUT THE INVENTION

An embodiment of this invention will now be described with reference to the accompanying drawings.

FIGS. 1 to 28 show an embodiment of the present invention.

Figure 1:
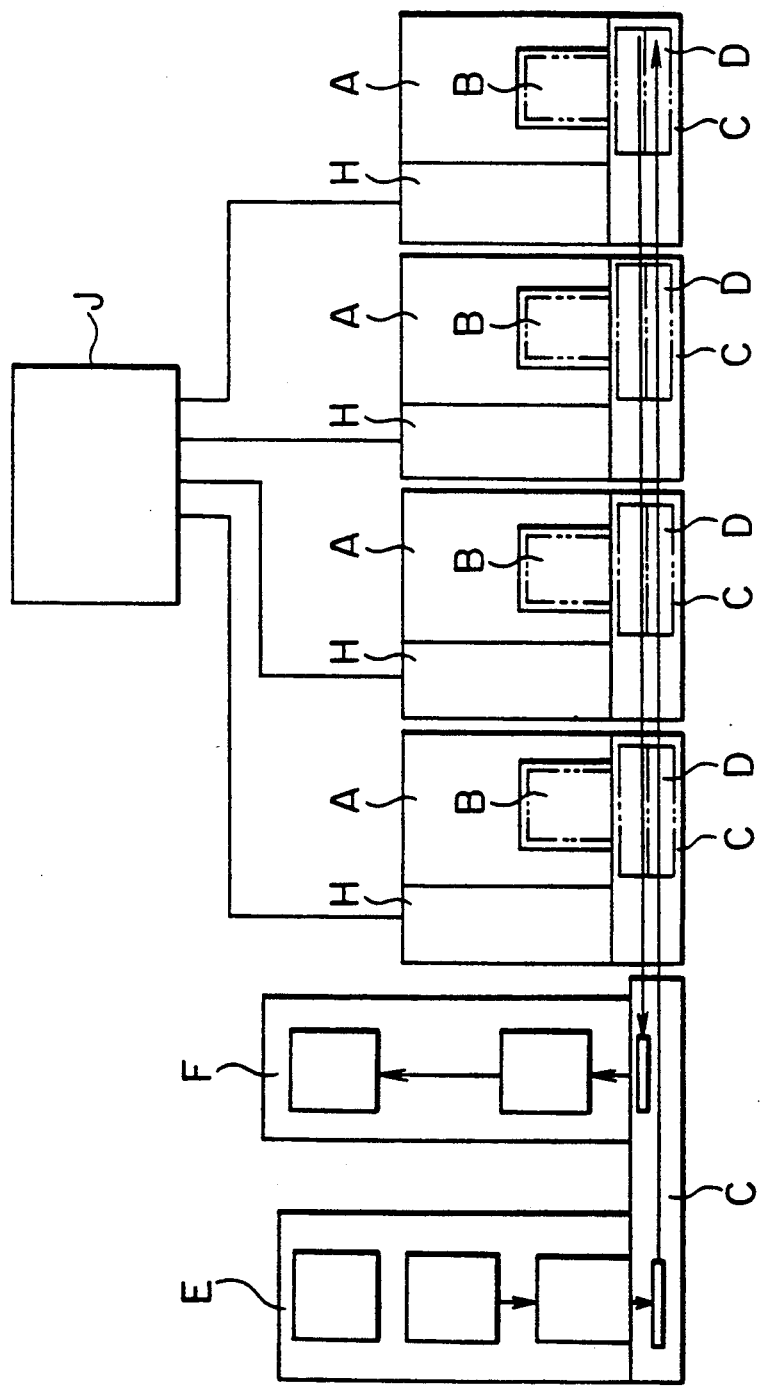
FIG. 1 is a plan view of a printed circuit board processing apparatus in accordance with this invention.

FIG. 1 shows the general construction of this invention; in the drawing, the reference symbol A indicates printed circuit board processing machines, four of which are arranged in a row. The reference symbols B indicates tipping devices, which are respectively incorporated into the printed circuit board processing machines A. The reference symbol C indicates conveying devices, which are respectively provided beside the printed circuit board processing machines A. The reference symbol D indicates loading/unloading devices, which are respectively arranged along the conveying devices C so as to effect the delivery of printed circuit boards between the tipping devices B and the conveying devices C associated therewith. The reference symbol E indicates a printed circuit board feeder, which is connected to one end of the feeding-path-side portion of each conveying device C; and the reference symbol F indicates a printed circuit board collecting device, which is connected one end of the discharging-path-side portion of each conveying device C.

The reference symbol H indicates controllers, which respectively control the printed circuit board processing machines A. The reference symbol J indicates an external memory for storing the types of printed circuit boards to be processed and the processing conditions and the processing programs for them.

FIG. 2 shows a workpiece which is to be supplied to any one of the printed circuit board processing machines A. In the drawing, the reference symbol W indicates the workpiece, which is composed of an upper plate, a lower plate, and a printed circuit board that are stacked together. The reference symbol P indicates reference pins press-fitted into the workpiece W for the purpose of enabling it to be secured in position on the table of the printed circuit board processing machine A.

The reference symbol M indicates a mark provided for the purpose of enabling the workpiece W to be identified.

Figure 4:
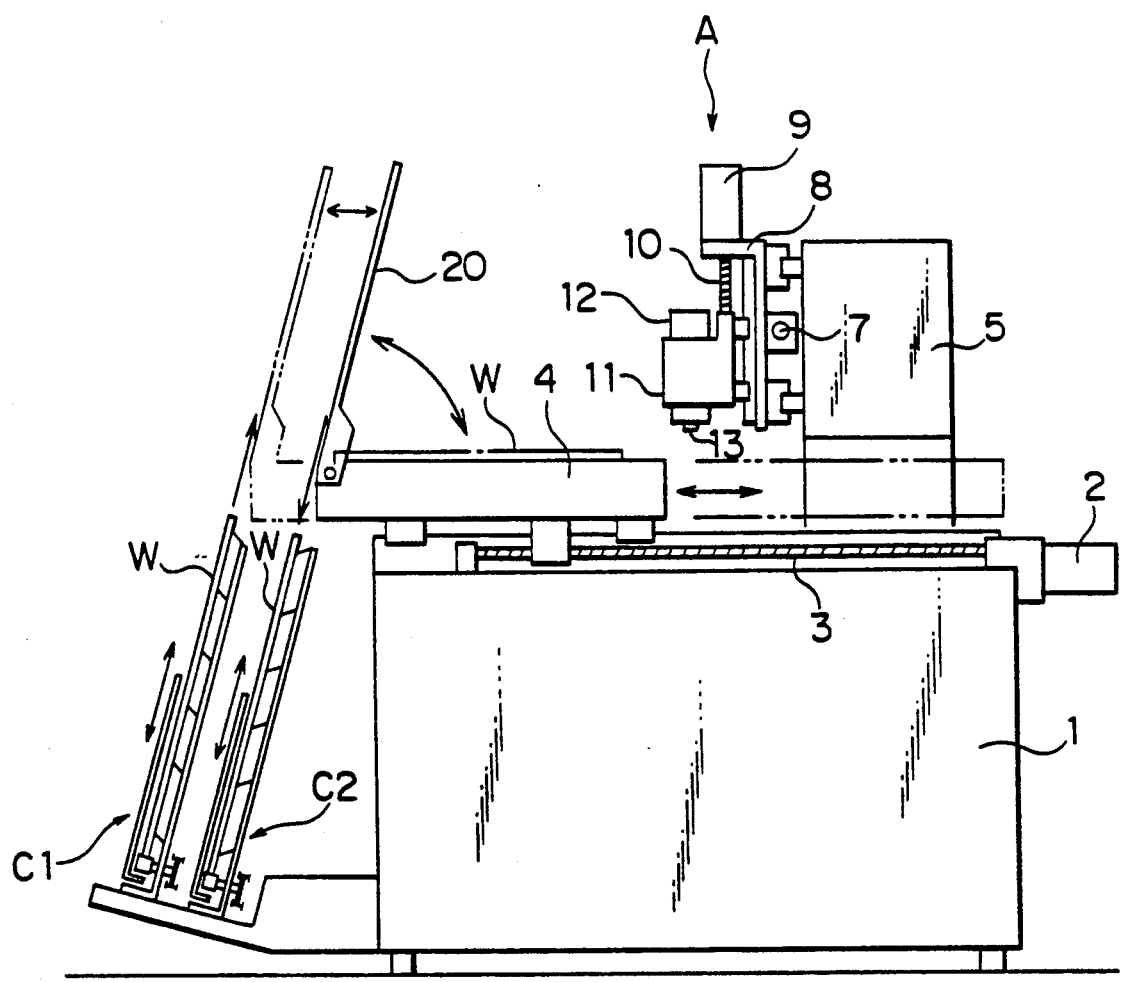
FIG. 4 is a side view showing the relationship between the printed circuit board processing machine and a conveying device associated therewith.

FIGS. 3 and 4 show one of the printed circuit board processing machines A. In the drawing, numeral 1 indicates a bed, and numeral 2 indicates a motor, which is secured to the bed 1. Numeral 3 indicates a feed screw, which is rotatably supported by the bed 1 and whose one end is connected to the motor 2. Numeral 4 indicates a table, which is equipped with a nut threadedly engaged with the feed screw 3 and which is supported by the bed 1 in such a manner as to be slidable in the direction parallel to the axis of the feed screw 3.

When the motor 2 operates to cause the feed screw 3 to rotate, the table 4 moves in the horizontal direction (as seen in FIG. 4) (the X-direction).

Numeral 5 indicates a column, which is secured to the bed 1 in such a manner as to be astride of the table 4. Numeral 6 indicates a motor, which is secured to the column 5. Numeral 7 indicates a feed screw, which is rotatably supported by the column 5 and whose one end is joined to the motor 6. Numeral 8 indicates a cross slide, which is equipped with a nut threadedly engaged with the feed screw 7 and which is supported by the column 5 in such a manner as to be movable in the direction parallel to axis of the feed screw 7.

And when the motor 6 operates to cause the feed screw 7 to rotate, the cross slide 8 moves backward and forward (as seen in FIG. 4) (the Y-direction).

Numeral 9 indicates a motor, which is secured to the cross slide 8. Numeral 10 indicates a feed screw, which is rotatably supported by the cross slide 8 and whose one end is joined to the motor 9. Numeral 11 indicates a saddle, which is equipped with a nut threadedly engaged with the feed screw 10 and which is supported by the cross slide 8 in such a manner as to be movable in the direction parallel to the axis of the feed screw 10.

And when the motor 9 operates to cause the feed screw 10 to rotate, the saddle 11 moves in the vertical direction (as seen in FIG. 4) (the Z-direction).

Numeral 12 indicates a spindle unit, which is supported by the saddle 11. Numeral 13 indicates a spindle, which is rotatably supported by the spindle unit 12. Supported at the lower end of this spindle 13 is a collet chuck, by means of which a processing tool is held detachably.

With this printed circuit board processing machine A thus constructed, the workpiece W fed onto the table 4 and the tool held by the spindle 13 are caused to make a relative movement in the X-, Y- and Z-directions, thereby performing the processing of the workpiece W.

Numeral G indicates a detector, which is secured to the saddle 11. This detector G may consist, for example, of a barcode reader, a plurality of photoelectric transfer elements, or the photoreceptor elements thereof.

Figure 5:
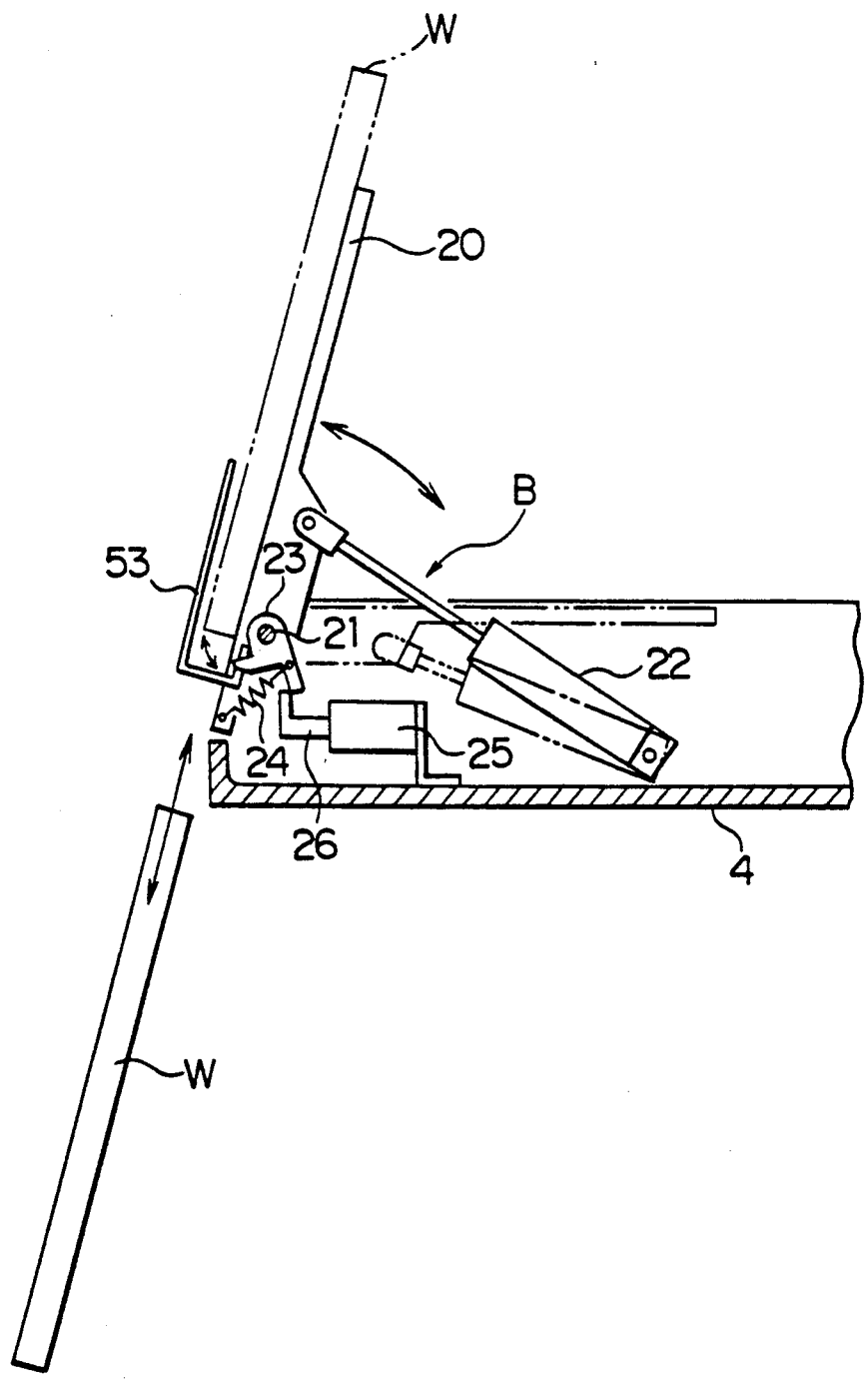
FIG. 5 is a side sectional view of a tipping device.
Figure 6:
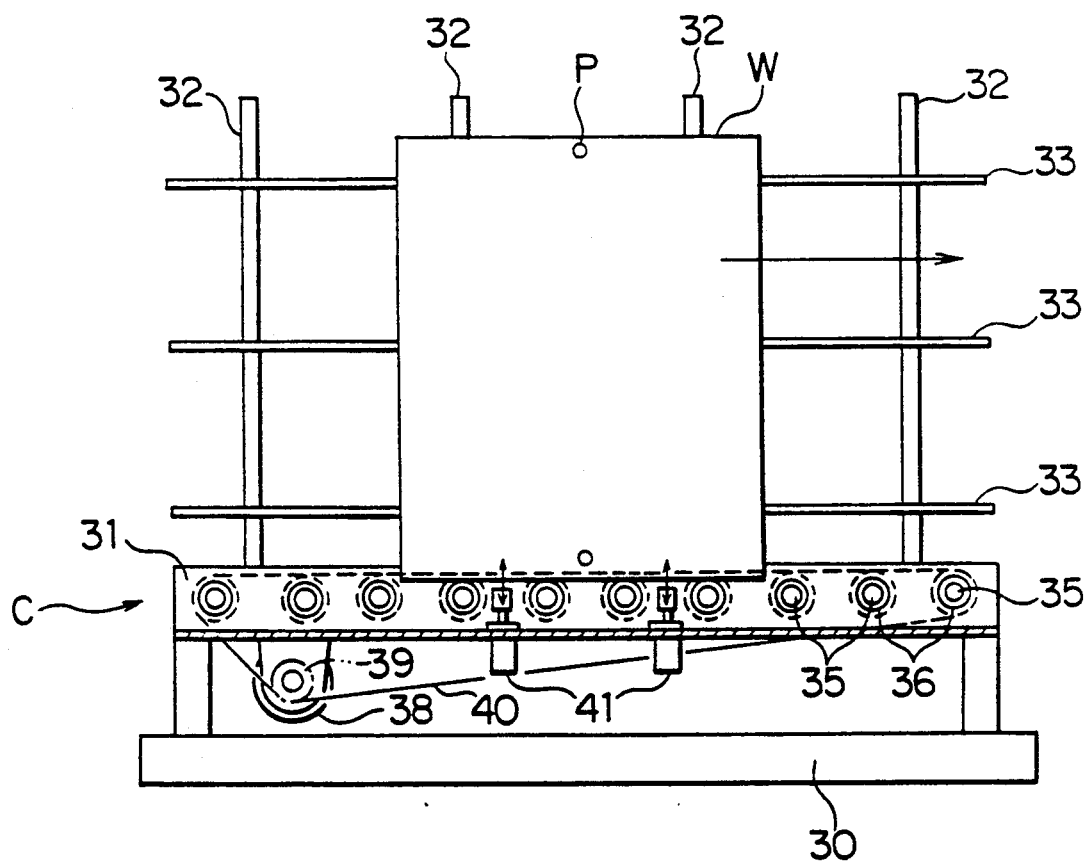
FIG. 6 is a front view of a conveying device.

FIG. 5 shows one of the tipping devices B, which is incorporated into the table 4 of the associated printed circuit board processing machine A.

Numeral 20 indicates a lattice-shaped tipping arm, which is rotatably supported at one end of the table 4 through the intermediation of an axle 21. When it is pulled down to the table 4, this tipping table 20 is fitted into a groove formed on the upper surface of the table 4 and is lodged therein Numeral 22 indicates a cylinder, one end of which is rotatably supported by the table 4 and the other end of which is rotatably linked with the tipping arm 20.

Thus, when the cylinder 22 operates, the tipping arm 20 makes a swinging movement on the axle 21.

Numeral 23 indicates a claw, which is rotatably supported by the axle 21. Numeral 24 indicates a spring, which is stretched between the tipping arm 20 and the claw 23, serving to impart a torque to the claw 23. Numeral 25 indicates a cylinder, which is supported by the table 4. Numeral 26 indicates a lever joined to a movable member of the cylinder 25 in such a manner as to be engaged with one end of the claw 23.

And the claw 23 is constantly biased by the tensile strength of the spring 24 in such a manner as to protrude into the feeding path for the workpiece W; only when the cylinder 25 operates to cause it to be pulled by the lever 26, this claw 23 moves to clear the feeding path for the workpiece W.

FIGS. 6 to 9 show one of the conveying devices C, which comprises a first conveying device C1 forming a feeding path and a second conveying device C2 forming a discharging path. Since these first and second conveying devices C1 and C2 are of the same construction, only the first conveying device C1 will be described here, with the second conveying device C2 being shown with the same reference numerals as those of the first conveying device C1.

Figure 9:
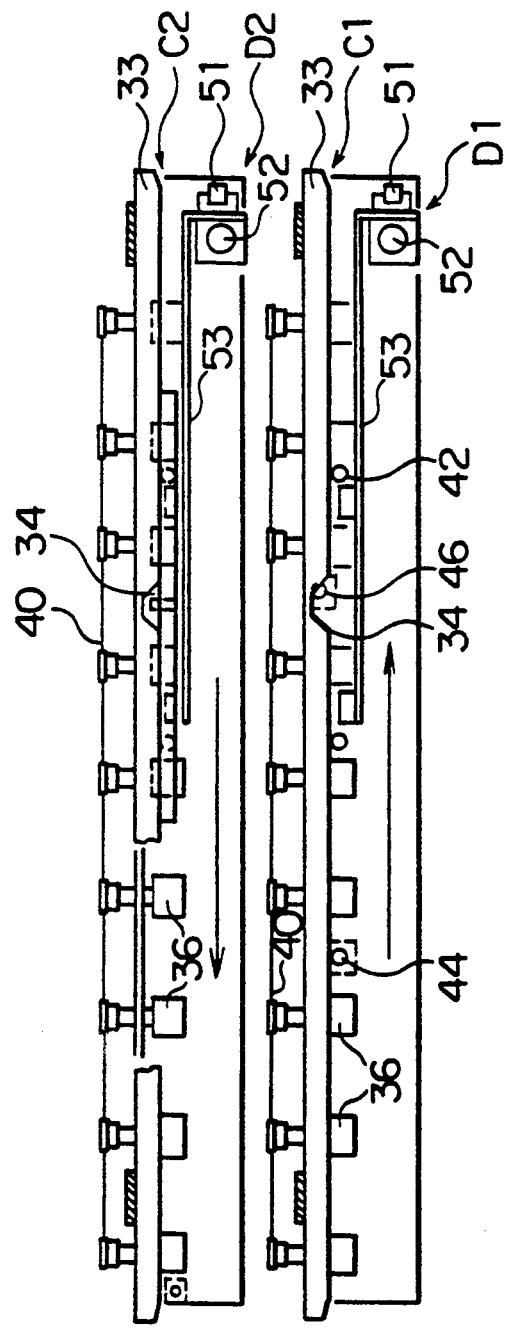
FIG. 9 is, a plan view of FIG. 7.
Figure 10:
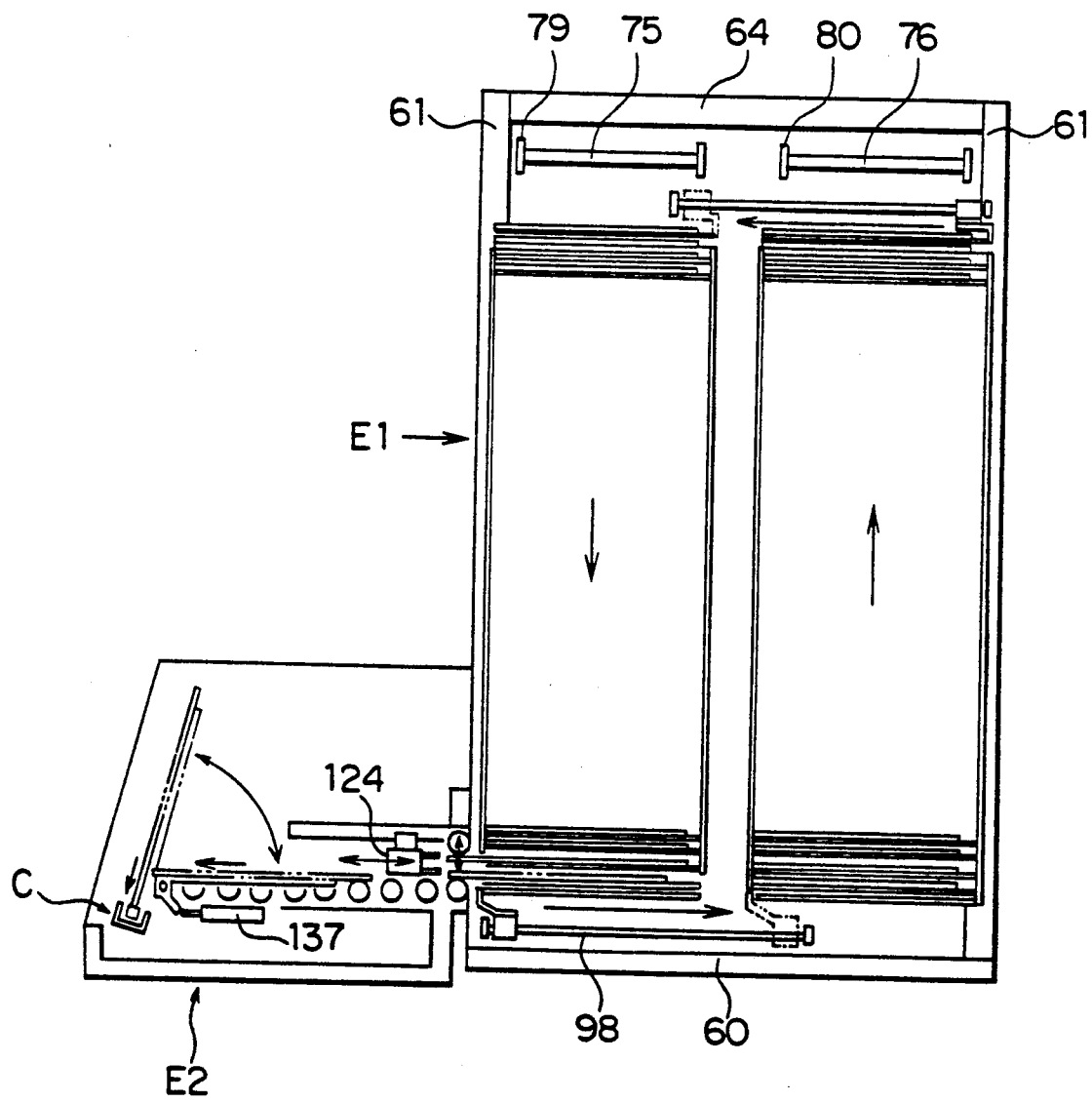
FIG. 10 is a side view of a feeder.
Figure 11:
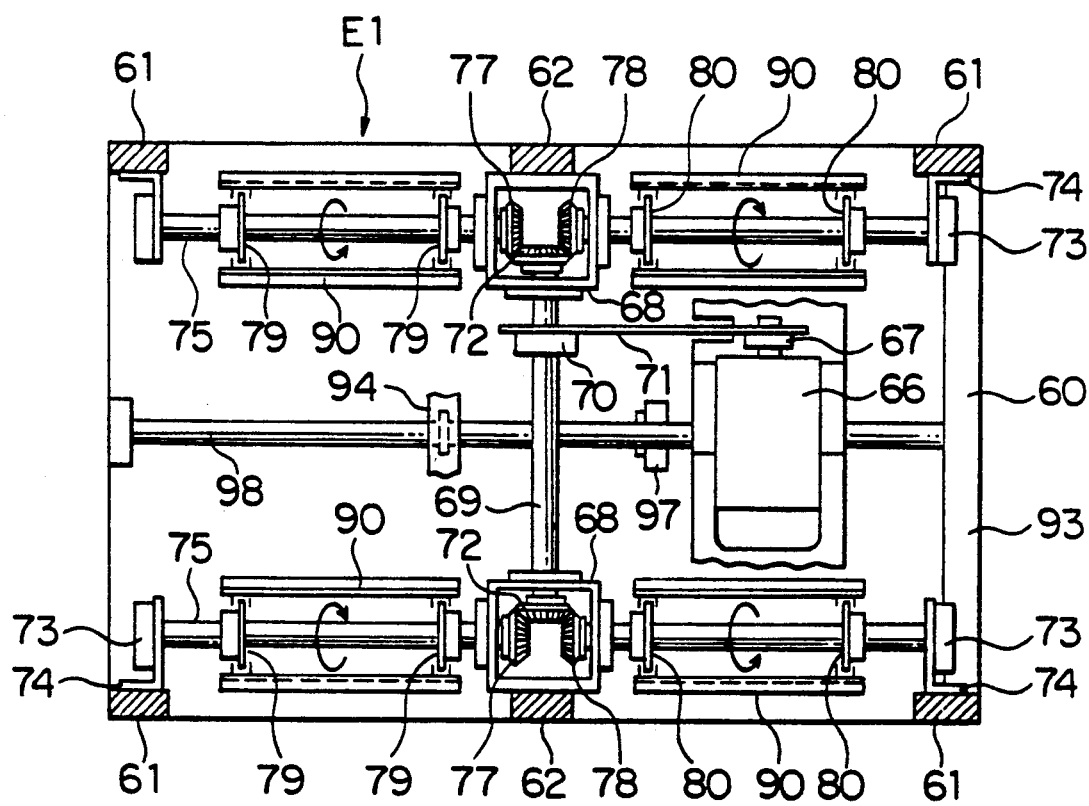
FIG. 11 is a plan view of the drive section of a stocker.
Figure 12:
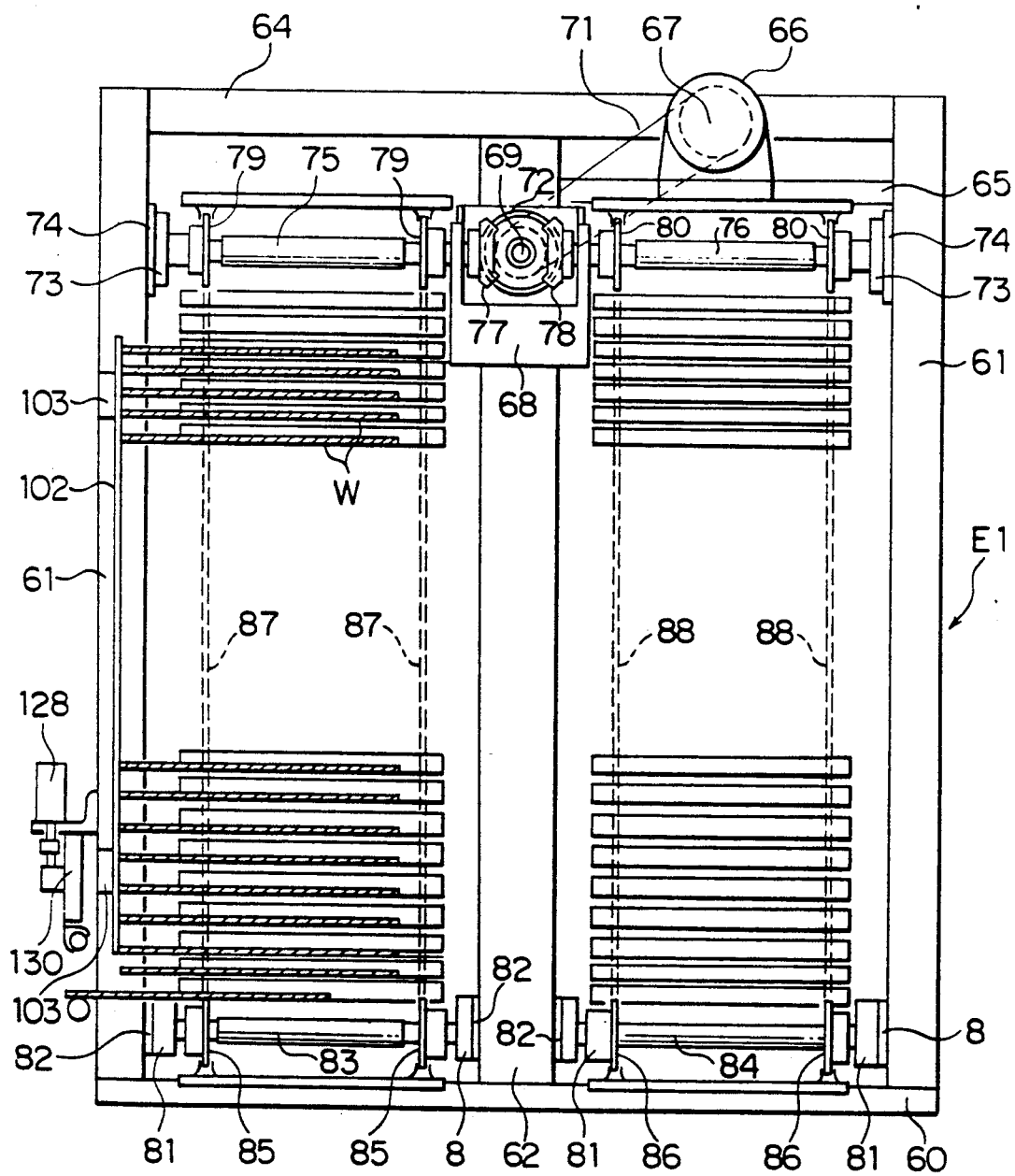
FIG. 12 is a side view of the stocker.
Figure 13:
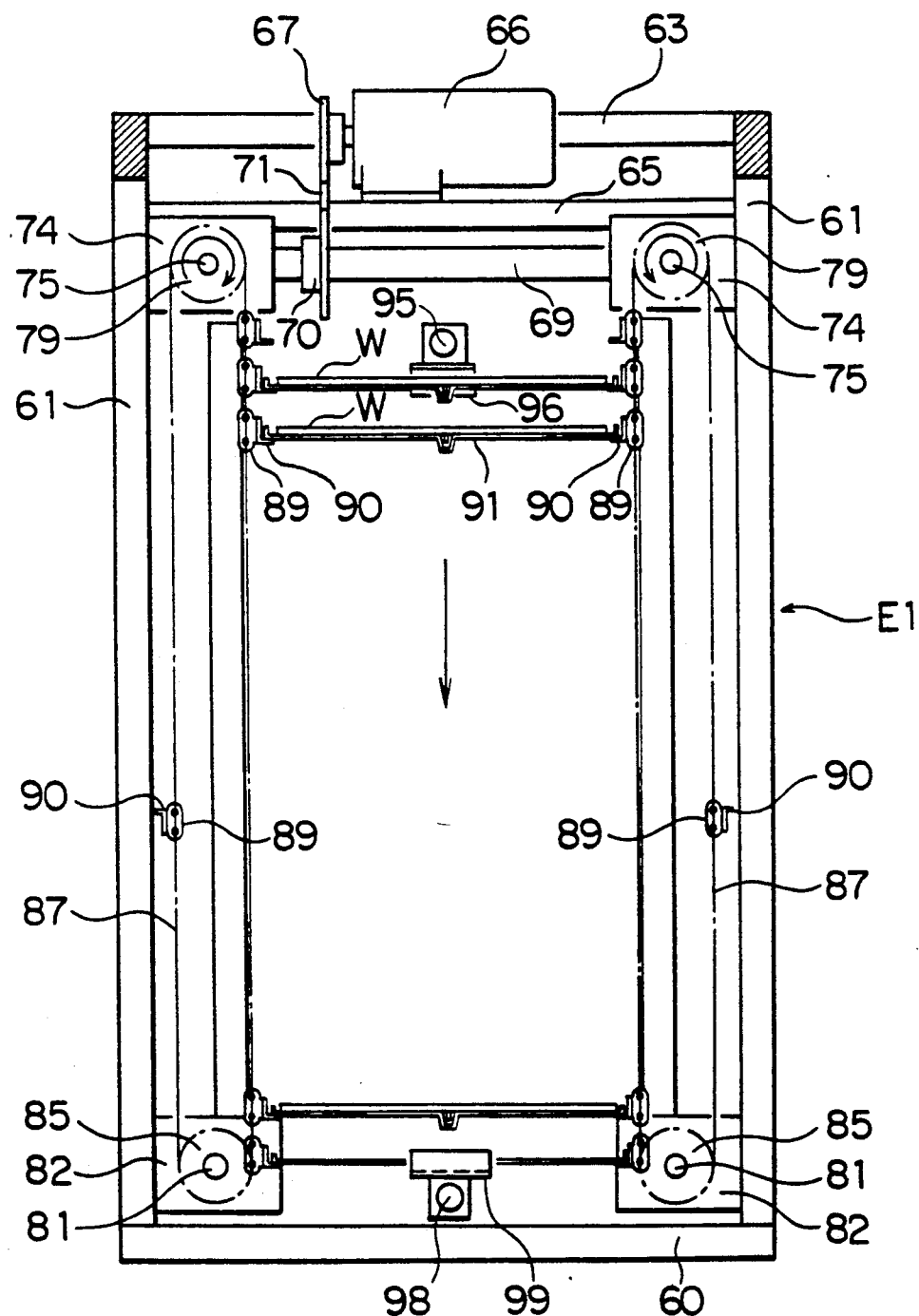
FIG. 13 is a front view of FIG. 12.

Numeral 30 indicates a base, which is provided on the bed 1 of the associated printed circuit board processing machine A. Numeral 31 indicates a rail, which is secured to the base 30. Numeral 32 indicates support bars, which are secured to the rail 31 at fixed intervals. Numeral 33 indicates guides, which are secured to the support bars 32 at fixed intervals. As shown in FIG. 9, formed at fixed positions on these guides 33 are grooves 34 so as to allow the passage of the reference pins P when the workpiece W is raised or lowered.

Numeral 35 indicates axles, which are arranged at fixed intervals and rotatably supported by the rail 31. Numeral 36 indicates rollers respectively fixed at one end of the each axle. Numeral 37 indicates sprockets, which are respectively attached to one end of each axle 35. Numeral 38 indicates a motor, which is secured to the rail 31. Numeral 39 indicates a sprocket, which is secured to the motor 38. Numeral 40 indicates a chain, which runs through the sprockets 37 and 39.

A workpiece W can be conveyed by operating the motor 38 to rotate the rollers 36 and placing it on these rollers.

Numeral 41 indicates cylinders, which are fixed at predetermined positions set before a workpiece feeding position of the rail 31, in such a manner as to face the conveying path for the workpiece W. Numeral 42 indicates cylinders, which are fixed at workpiece delivery positions on the rails 31, in such a manner as to face the conveying path for the workpiece W, which is conveyed by the conveying device C.

When these cylinders 41 and 42 are operated, and the workpiece W is raised by their movable members to lift the workpiece W from the rollers 36, the conveyance of the workpiece W can be interrupted.

Numeral 43 indicates a cylinder, which are secured to the rail 31, at a position between the cylinders 41 and 42. Numeral 44 indicates a stopper, which is secured to the cylinder 43 in such a manner as to face the conveying path for the workpiece W.

Numeral 45 indicates a cylinder, which is secured to the rail 31, at a position between cylinders 42. Numeral 46 indicates a stopper, which is secured to the cylinder 45 in such a manner as to face the movement path of the reference pins P.

Thus, when these cylinders 43 and 45 are operated to protrude the stoppers 44 and 46, the workpiece W can be stopped at a fixed position.

Figure 7:
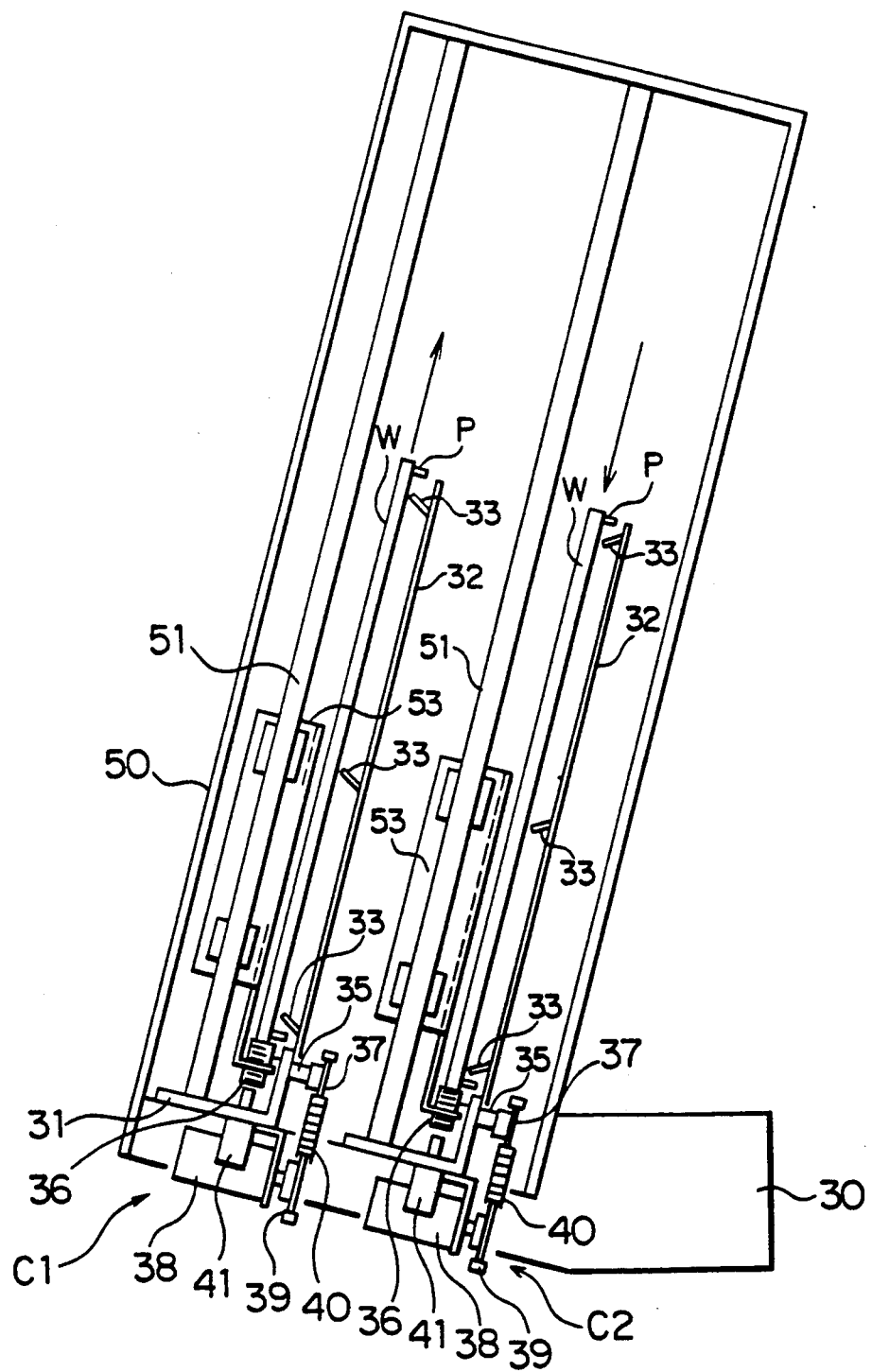
FIG. 7 is a side view showing the relationship between the conveying device and a loading/unloading device associated therewith.
Figure 8:
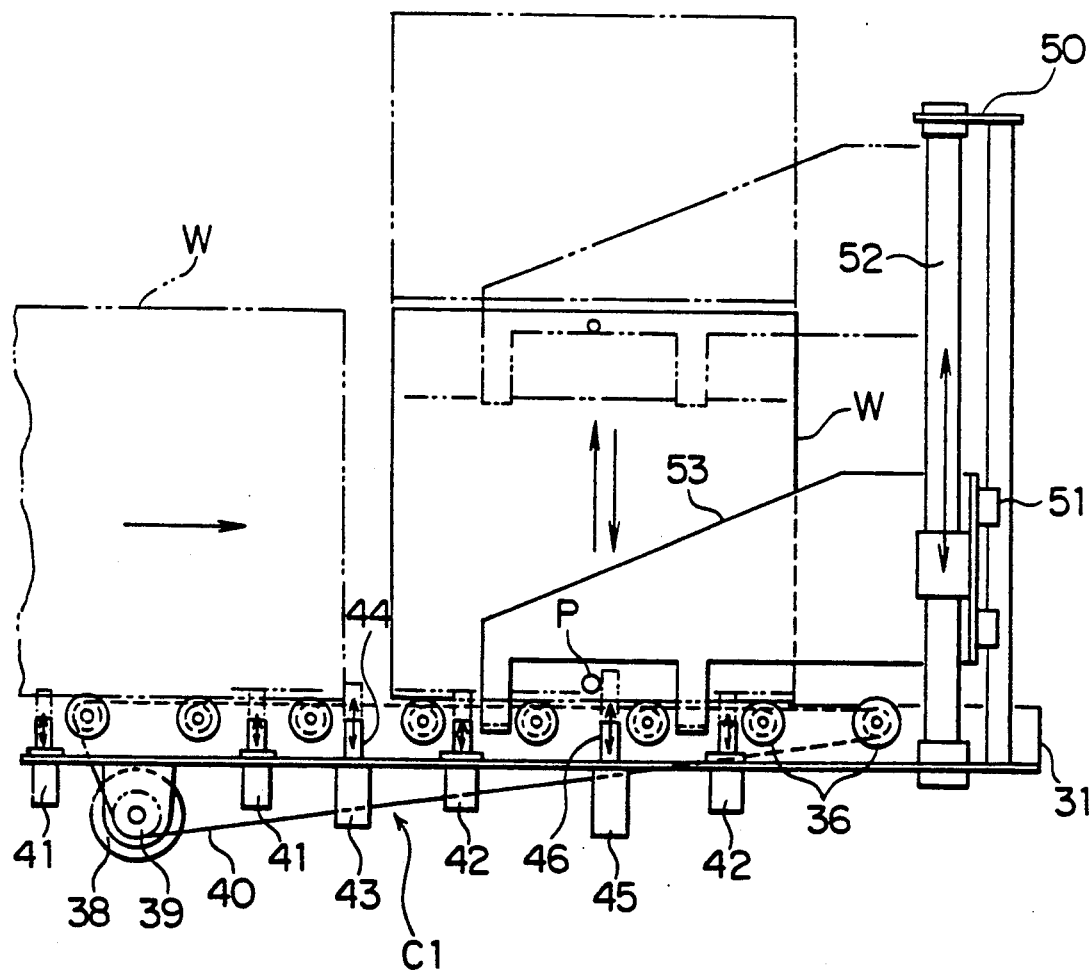
FIG. 8 is a front view of FIG. 7.

FIGS. 7 through 9 show one of the loading/unloading devices D; it consists of a first loading/unloading device D1 provided on the side of the first conveying device C1 and a second loading/unloading device D2 provided on the side of the second conveying device C2. Since these first and second loading/unloading devices D1 and D2 are of the same construction, only the first loading/unloading device D1 will be described here, with the second loading/unloading device D2 being shown with the same reference numerals as those of the first loading/unloading device D1.

Numeral 50 indicates a frame, which is secured to the base 30 of the associated conveying device C. Numeral 51 indicates a linear guide device, which is fixed between the rail 31 and the frame 50. Numeral 52 indicates a rodless-type air-cylinder, which is fixed between the rail 31 and the frame 50 in such a manner as to be parallel to the linear guide device 51. Numeral 53 indicates a lifter, which is movably supported by the linear guide device 51 and connected with a movable member of the air-cylinder 52.

When the air-cylinder 52 operates, the lifter 53 is raised or lowered. If, at this time, a workpiece W exists in the movement path of the lifter 53, the lifter 53 raises the workpiece W.

FIGS. 10 to 18 show the feeder E of workpieces W. This feeder E is composed of a stocker E1 for storing workpieces W to be processed and a delivery device E2 for extracting workpieces W from the stocker E1 and transferring them therefrom to the conveying devices C.

FIGS. 10 to 16 show the stocker E1; in the drawing, Numeral 60 indicates a base, and numerals 61 and 62 indicate struts, which are arranged upright on the base 60. Numeral 63 indicates a beam, which is attached to the upper ends of the struts 61. Numeral 64 indicates a girder, which is attached to the upper ends of the struts 61 and 62. Numeral 65 indicates a support plate, which is attached to the upper sections of the struts 61 and 62.

Numeral 66 indicates a motor, which is secured to the support plate 65. Numeral 67 indicates a sprocket, which is attached to the motor 66. Numeral 68 indicates gear boxes, which are attached to the upper sections of the struts 62. Numeral 69 indicates a driving shaft, which is rotatably supported by the gear boxes 68. Numeral 70 indicates a sprocket, which is attached to the driving shaft 69. Numeral 71 indicates a chain, which is stretched between the sprockets 67 and 70. The reference numeral 72 indicates driving gears, which are respectively attached to the ends of the driving shaft 69. Numeral 73 indicates bearings, which are fastened to the struts 61 through the intermediation of brackets 74. Numerals 75 and 76 indicate shafts, which are rotatably supported by the gear boxes 68 and the bearings 73. Numerals 77 and 78 indicate gears, which are respectively attached to one end of each of the shafts 75 and 76 in such a manner as to be in mesh with the driving gears 72.

Thus, when the motor 66 operates, the shafts 75 and 76 rotate in opposite directions.

Figure 14:
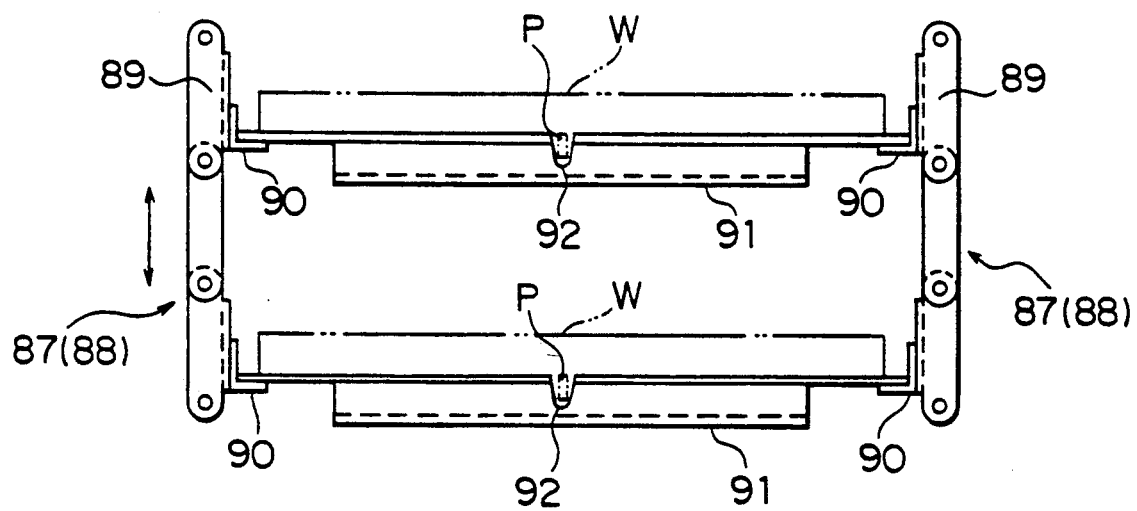
FIG. 14 is a front view showing the relationship between links forming chains, guides, and pallets.

Numerals 79 and 80 indicate sprockets, which are respectively attached to the shafts 75 and 76. Numeral 81 indicates bearings, which are secured to the struts 61 and 62 through the intermediation of brackets 82. Numerals 83 and 84 indicate driven shafts, which are rotatably supported by the bearings 81. Numerals 85 and 86 are sprockets, which are respectively attached to the driven shafts 83 and 84. Numerals 87 and 88 indicate chains, which are, as shown in FIG. 14, composed of links 89, to which L-shaped guides 90 are attached, and are respectively stretched between the sprockets 79 and 85 and between the sprockets 80 and 86.

The chains 87 and 88 run in opposite directions.

Numeral 91 indicates pallets, on each of which is formed a groove 92 to allow the passage of the reference pins P and which are detachably supported by the guides 90.

Numeral 93 and 94 indicate brackets, which are respectively secured to the struts 61 and 62. Numeral 95 indicates a rodless-type air-cylinder, which is supported by the brackets 93 and 94. Numeral 96 indicates a claw, which is joined to a movable member of the air-cylinder 95.

Figure 15:
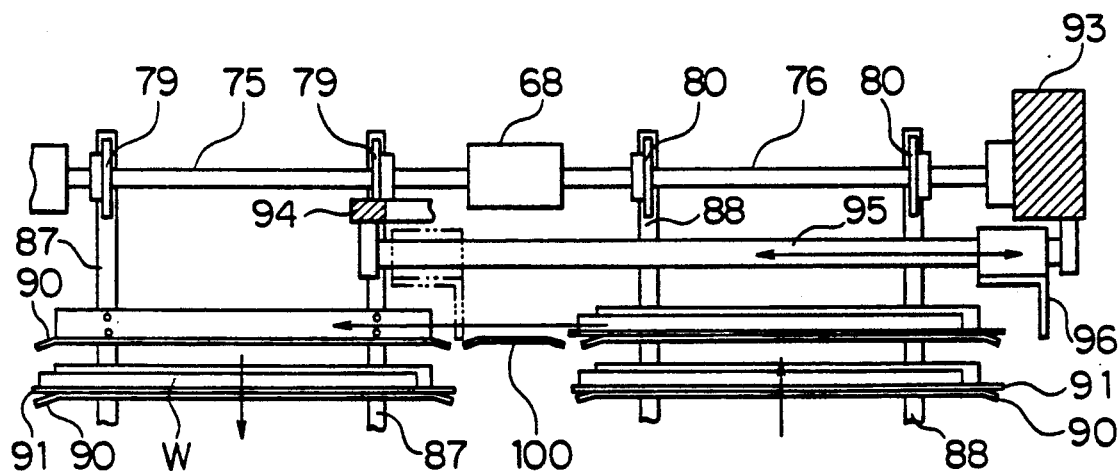
FIG. 15 is a side view showing a pallet feeding mechanism provided above the stocker.

When the air-cylinder 95 operates to cause the claw 96 to move from the right to the left (as seen in FIG. 15), the pallet 91 which is in the movement path of the claw 96 can be moved from the side of the chain 88 to the side of the chain 87. If, at this time, a workpiece 91 is on the pallet 91, this workpiece W also moves to the side of the chain 87.

Numeral 97 indicates brackets, which are secured to the base 60. Numeral 98 indicates a rodless-type air-cylinder, which is secured to the brackets 97. Numeral 99 indicates a claw, which is attached to a movable member of the air-cylinder 98.

Figure 16:
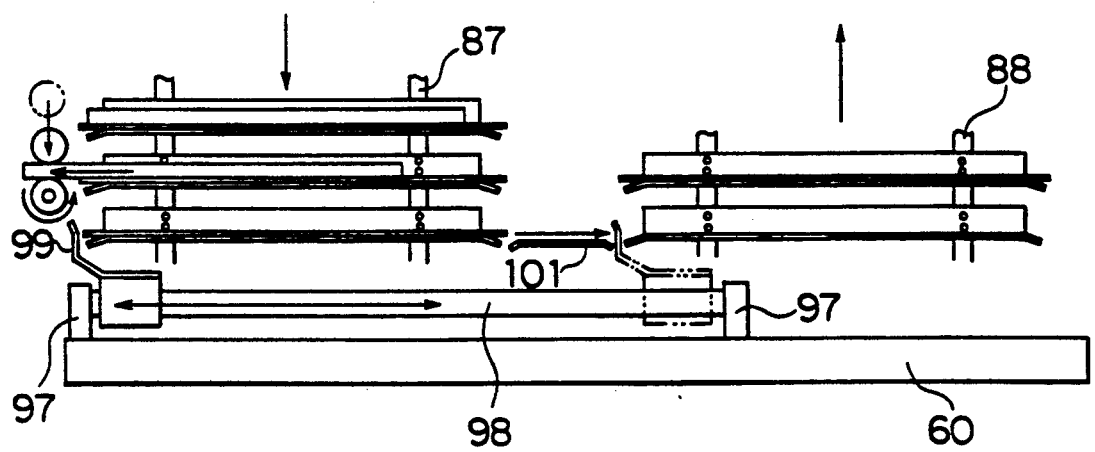
FIG. 16 is a side view showing a pallet feeding mechanism provided below the stocker.

When the air-cylinder 98 operates to cause the claw 99 to move from the left to the right (as seen in FIG. 16), a pallet 91 which is in the movement path of the claw 99 can be moved from the side of the chain 87 to the side of the chain 88.

Numerals 100 and 101 indicate guides, which are attached to the struts 62 in such a manner as to be situated on either side of the paths of the claws 96 and 99. Numeral 102 indicates a guide, which is attached to brackets 103 fixed between struts 61.

And the guide 102 comes into contact with one end of each of the workpieces W supplied to the side of the chain 87, setting the positions of their ends the workpieces W in alignment in the course of their movement.

FIGS. 10, 12, 17 and 18 show the delivery device E2. In the drawings, numeral 110 indicates a base, and numeral 111 indicates struts, a pair of which are fixed at either end of the base 110. Numeral 112 indicates a girder, which is attached to the struts 111.

Numeral 113 indicates shafts, which are rotatably supported by the girder 112. Numeral 114 indicates sprockets, which are respectively attached to one end of each shaft 113. Numeral 115 indicates rollers, which are respectively attached to one end of each shaft 113. Numeral 116 indicates a motor, which is secured to the base 110. Numeral 117 indicates a sprocket, which is fixed to the motor 116. Numeral 118 indicates a chain, which runs through the sprockets 114 and 117.

When the motor 116 operates, the rollers 115 rotate. If, at this time, a workpiece W is placed on the rollers 115, the workpiece W is conveyed by these rollers 115.

Numeral 119 indicates a frame, which is fixed to the girder 112. Numeral 120 indicates a linear guide device, which is supported by the frame 119. Numeral 121 indicates a cylinder, which is supported by the frame 119 through the intermediation of a bracket 122. Numeral 123 indicates a slider, which is attached to a movable member of the linear guide device 120 and joined to the movable member of the cylinder 121. Numeral 124 indicates a chuck, which is fixed to the slider 123. Numeral 125 indicates claws, which are swingably supported by the chuck 124, with their tip ends being adapted to be opened and closed by a cylinder and a cam (which are not shown) provided in the chuck 124.

Figure 17:
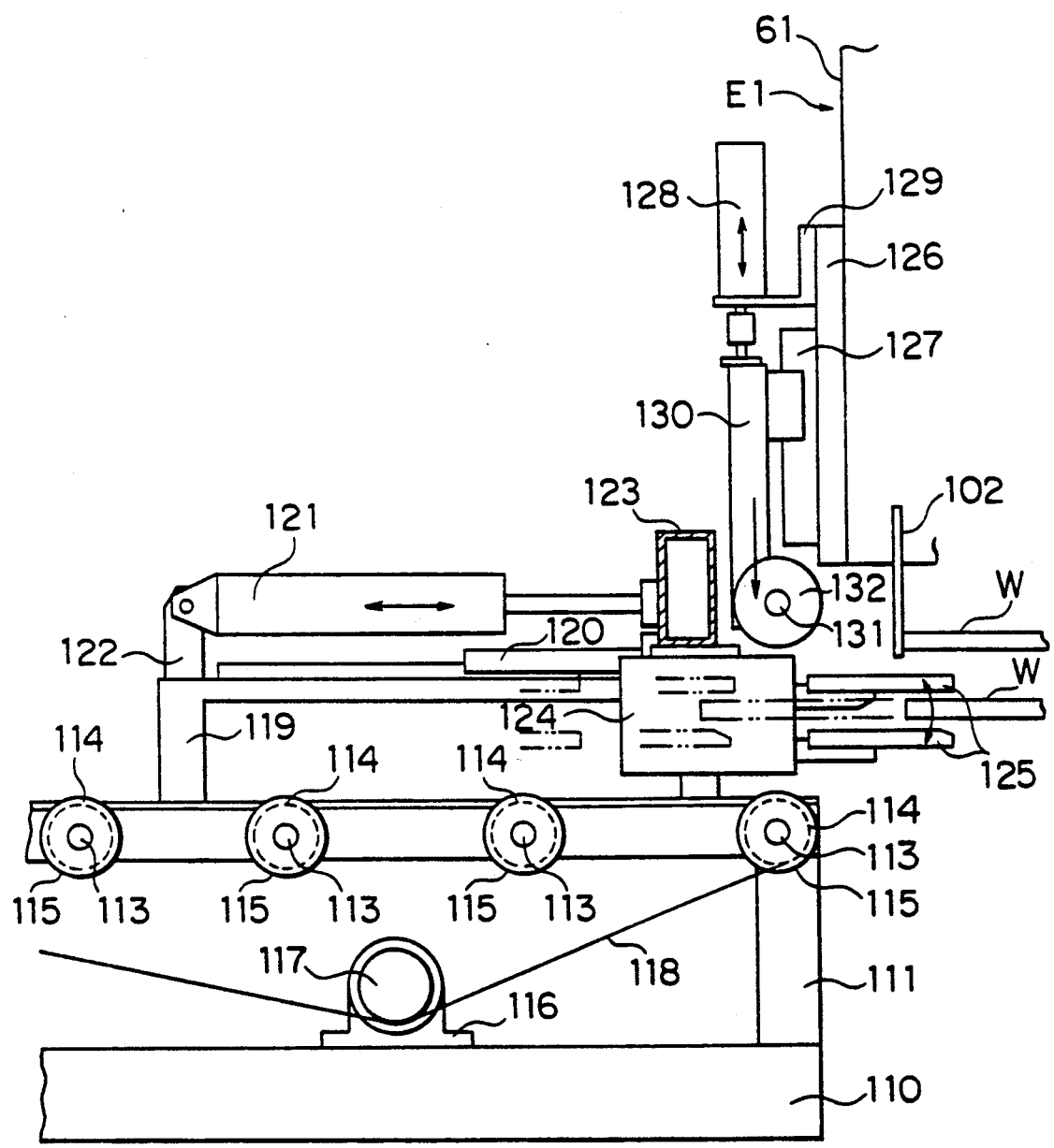
FIG. 17 is a side view of the work extracting section of a delivery device of the feeder.
Figure 18:
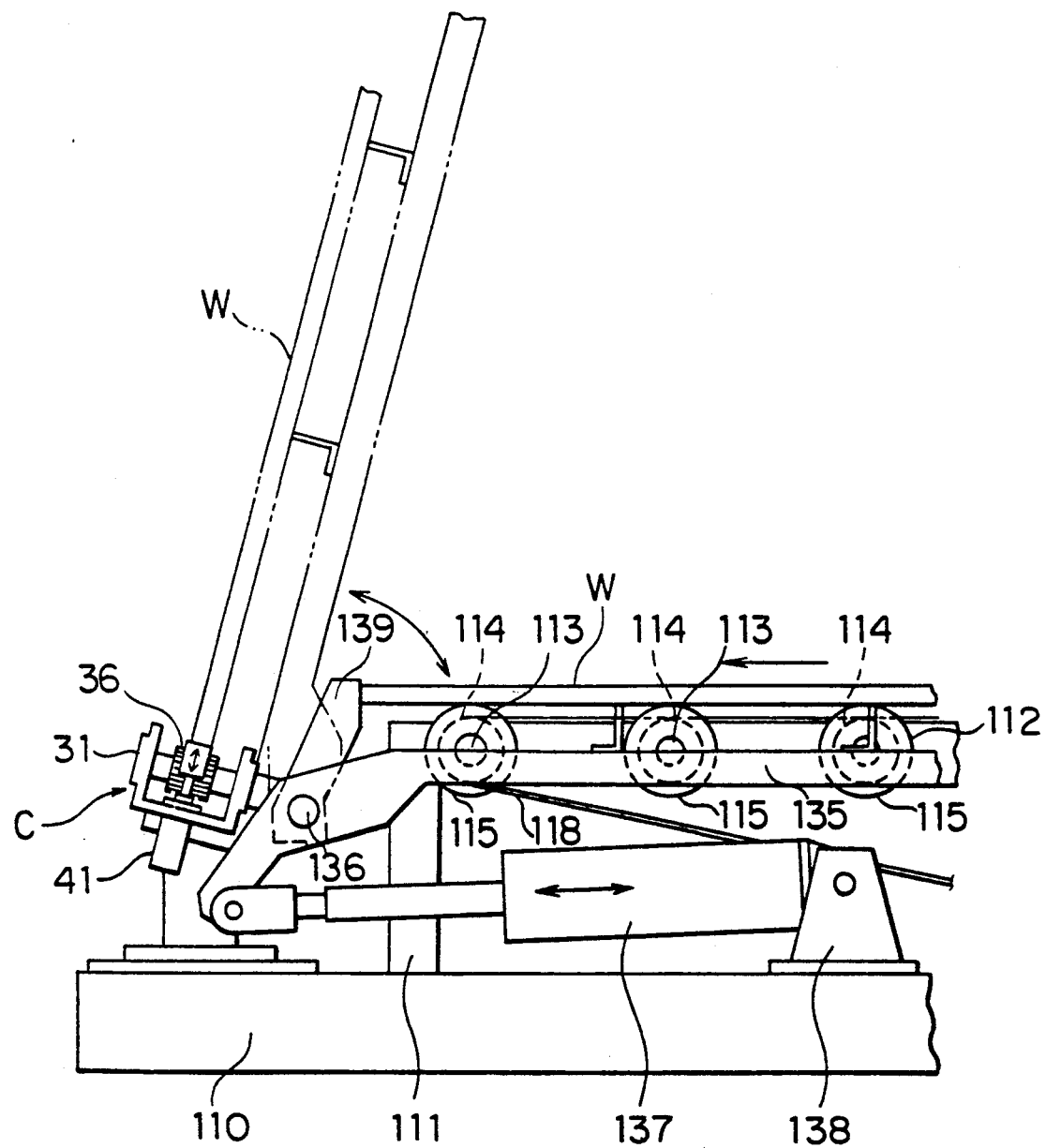
FIG. 18 is a side view of the work tipping section of the delivery device of the feeder.
Figure 19:
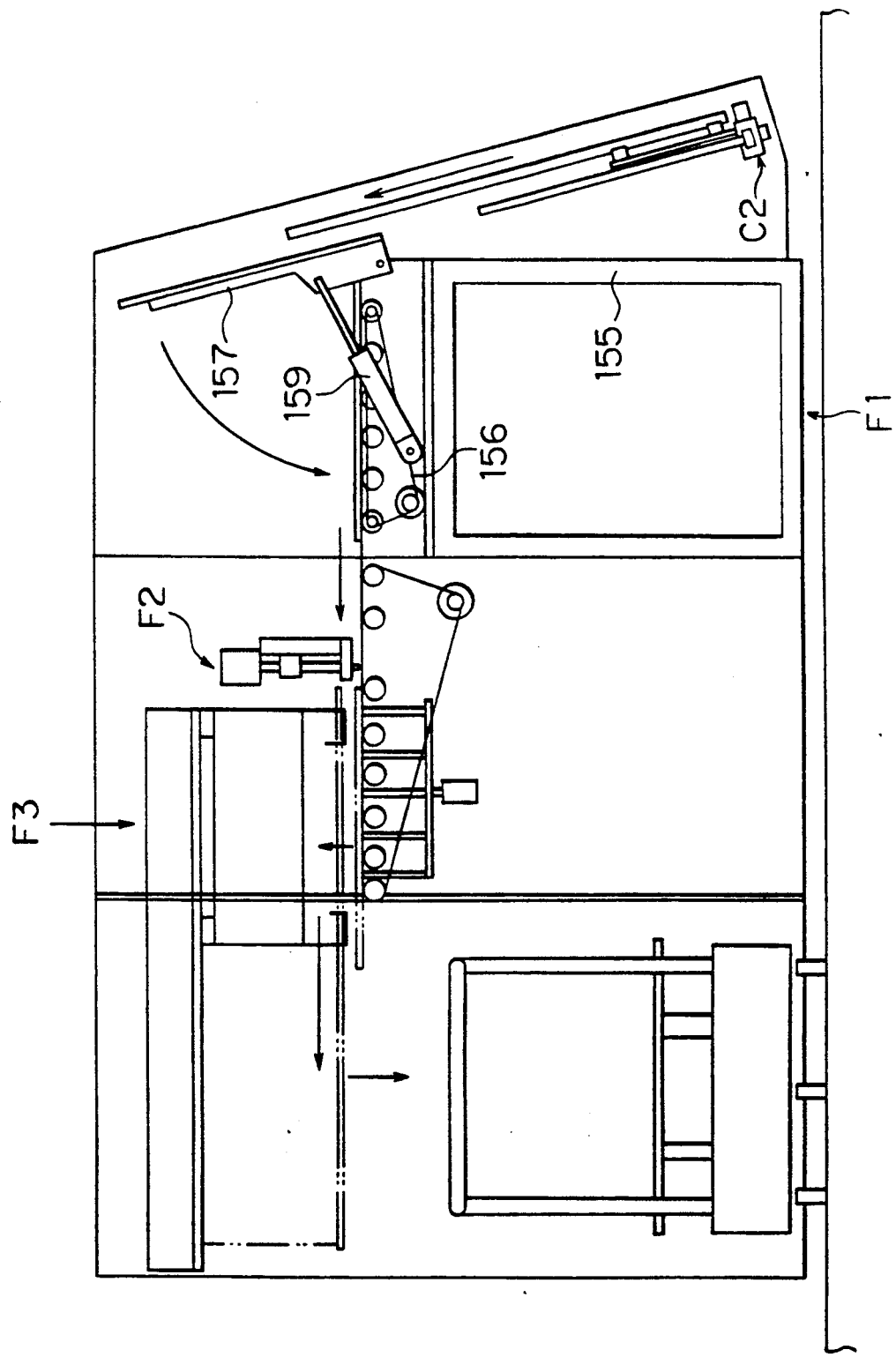
FIG. 19 is a side view of a collecting device.

When the cylinder 121 operates to cause the chuck 124 to move to the right side (as seen in FIG. 17), the claws 125 come to positions above and below a workpiece W. And when the cylinder of the chuck 124 operates to close the claws 125, the cylinder 121 operates to cause the chuck 124 to move to the left side (as seen in FIG. 17), extracting one end of the workpiece W to position it on the rollers 115.

Numeral 126 indicates a plate, which is fixed to the struts 61. Numeral 127 indicates a linear guide device, which is supported by the plate 126. Numeral 128 indicates a cylinder, which is secured to the plate 126 through the intermediation of a bracket 129. Numeral 130 indicates a slider, which is supported by a movable member of the linear guide device 127 and joined to the movable member of the cylinder 128. Numeral 131 indicates a shaft, which is fixed to the slider 130. Numeral 132 indicates a roller, which is rotatably supported by the shaft 131.

When the workpiece W extracted by the chuck 124 has descended to a position where it is in contact with the roller 115 at an extremity, the cylinder 128 operates to cause the roller 132 to descend, the workpiece W being pressed against the roller 115 by the roller 132.

Numeral 135 indicates a lattice-shaped tipping arm, which is fixed to a shaft 136 rotatably supported by a bracket (not shown). The reference numeral 137 indicates a cylinder, which is rotatably supported by the base 110 through the intermediation of a bracket 138. One end of this cylinder 137 is rotatably linked with one end of the tipping arm 135. Numeral 139 indicates a stopper, which is fixed to the axle 136.

When a workpiece W abuts against the stopper 139, the cylinder 137 operates to rotate the tipping arm 135 so as to make the workpiece W stand on end, feeding the workpiece W onto the rollers 36 of the conveying device C.

FIGS. 19 to 28 show the collecting device F, which consists of a first collecting device F1 for collecting workpieces W conveyed by the second conveying devices C2, a pin extractor F2 for extracting the reference pins P from the workpieces W, and a second collecting device F3 for collecting printed circuit boards from the workpieces W from which the pins P have been extracted.

Figure 20:
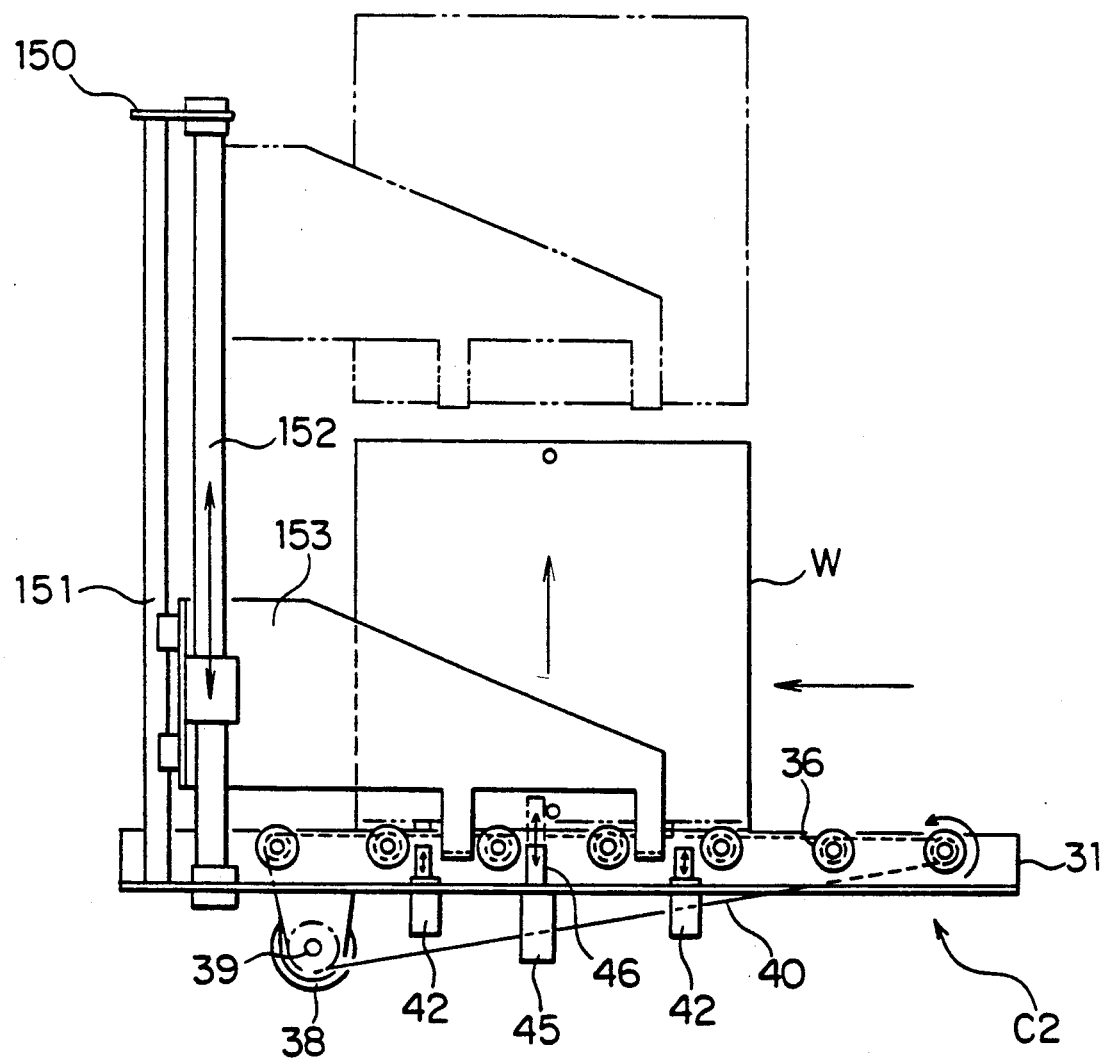
FIG. 20 is a front view showing the relationship between a conveying device and a first collecting device.
Figure 21:
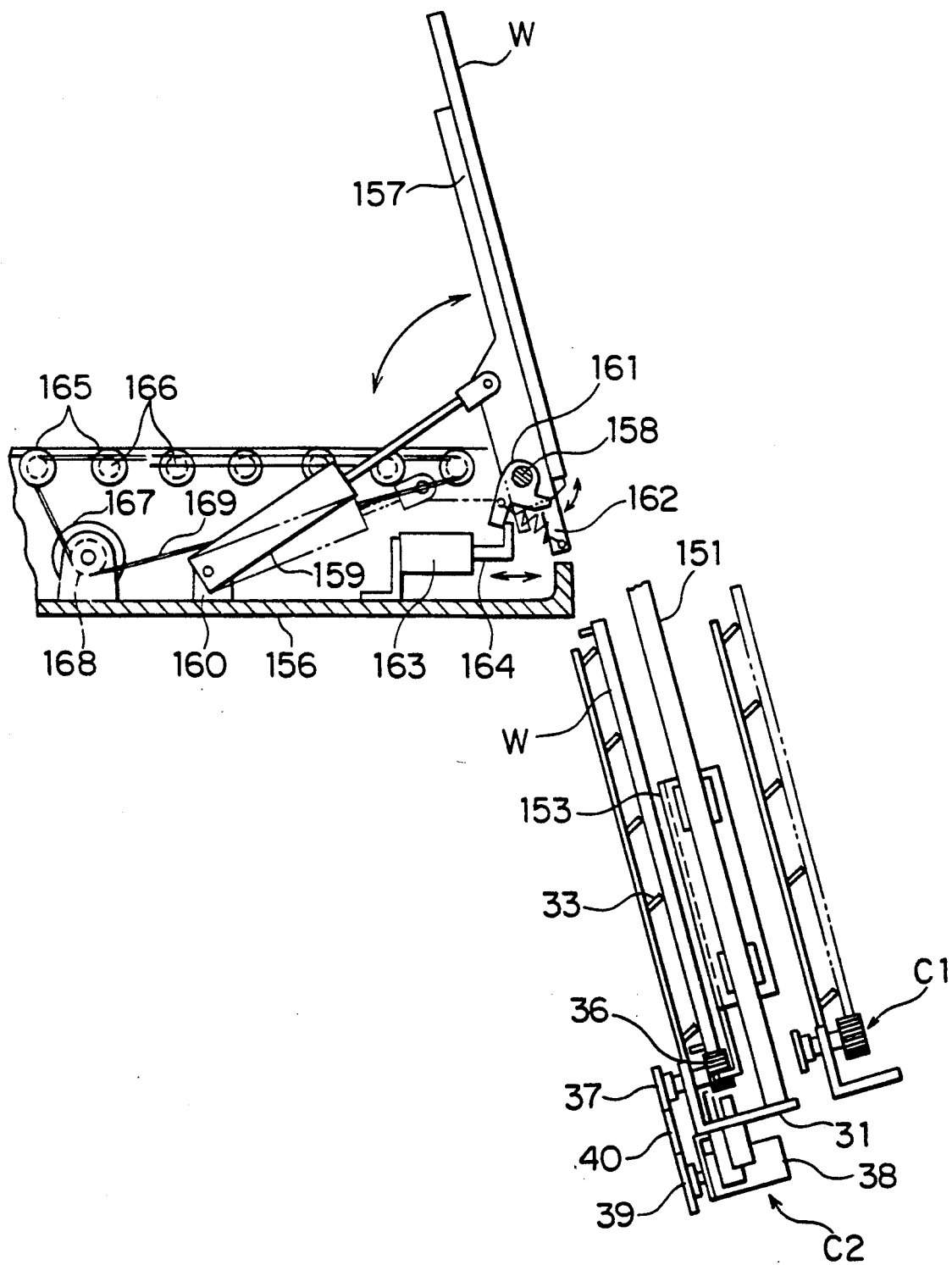
FIG. 21 is a side view of the first collecting device.
Figure 24:
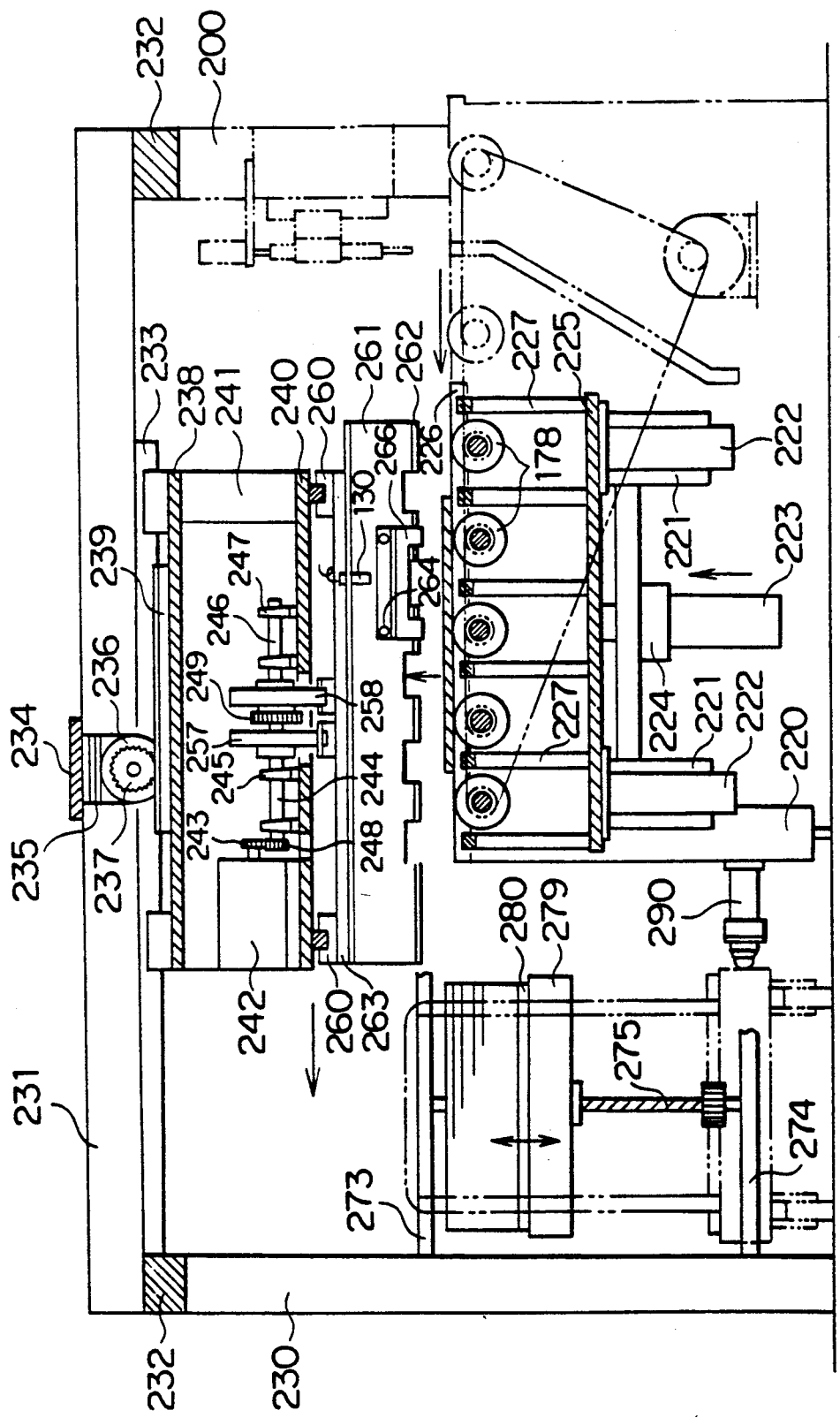
FIG. 24 is a side sectional view of a second collecting device.
Figure 26:
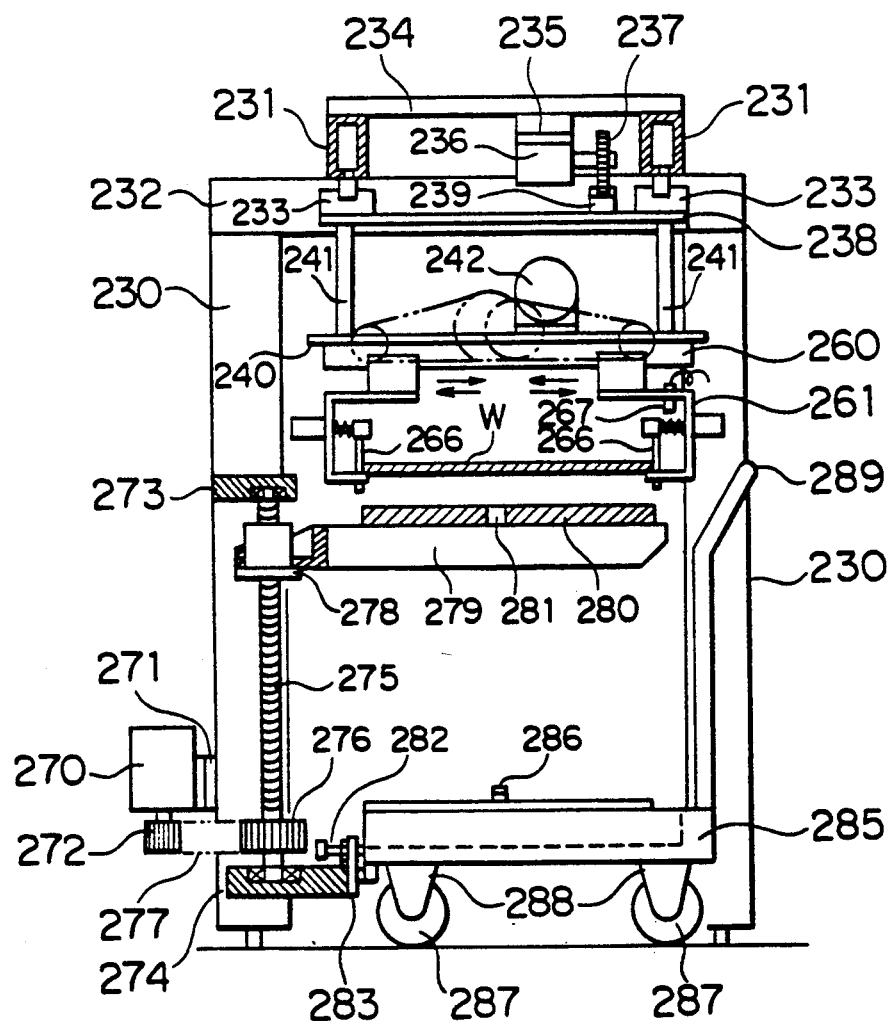
FIG. 26 is a rear sectional view of the second collecting device.
Figure 27:
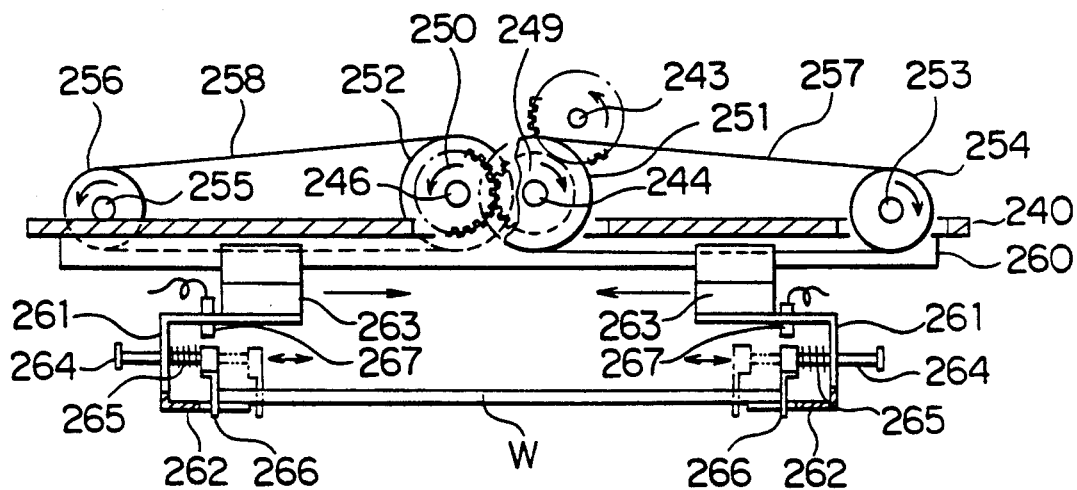
FIGS. 27 and 28 are front sectional views of the chuck opening/closing mechanism of the second collecting device.
Figure 28:
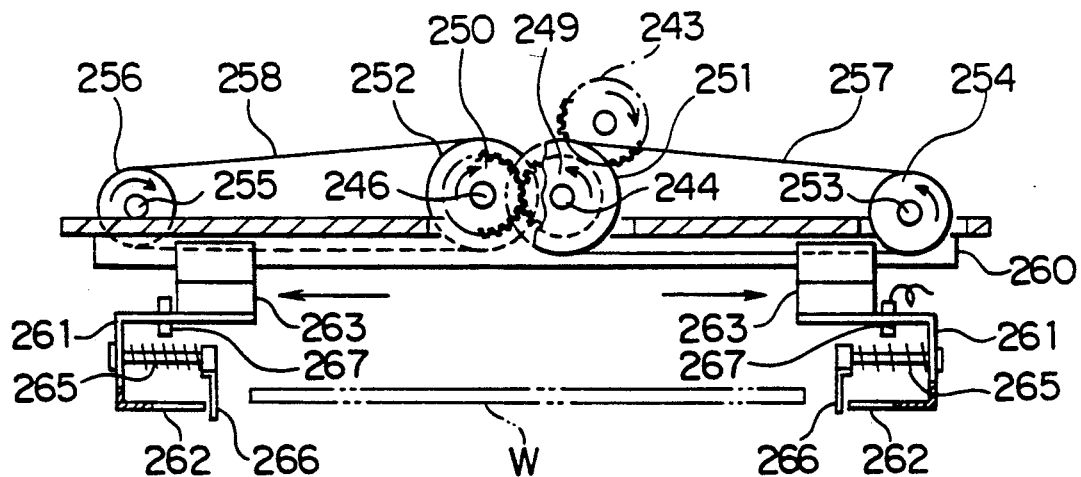

FIGS. 20 and 21 show the first collecting device F1. In the drawings, numeral 150 indicates a frame, which is fixed to the base 30 of the nearest conveying device C. Numeral 151 indicates a linear guide device, which is fixed between the rail 31 and the frame 150. Numeral 152 indicates a rodless-type air-cylinder, which is fixed between the rail 31 and the frame 150 in such a manner as to be parallel to the linear guide device 151. Numeral 153 indicates a lifter, which is movably supported by the linear guide device 151 and joined to a movable member of the air-cylinder 152.

When the air-cylinder 152 operates, the lifter 153 ascends or descends. If, at this time, a workpiece W is in the movement path of the lifter 153, the lifter 153 raises this workpiece W.

Numeral 155 indicates a frame, and numeral 156 indicates a base, which is fixed to the frame 155. Numeral 157 indicates a lattice-shaped tipping arm, which is fixed to an axle 158 which is rotatably supported by a bracket (not shown). Numeral 159 indicates a cylinder, which is rotatably supported by the base 156 through the intermediation of a bracket 160. One end of this cylinder 159 is rotatably linked with one end of the tipping arm 157.

When the cylinder 159 operates, the tipping arm 157 swings on the axle 158. If, at this time, a workpiece W has been supplied to the tipping arm 157, the workpiece W is pushed down to the horizontal direction.

Numeral 161 indicates a claw, which is rotatably supported by the axle 158. Numeral 162 indicates a spring, which is stretched between the tipping arm 157 and the claw 161 to impart a torque to the claw 161. Numeral 163 indicates a cylinder, which is supported by the base 156. Numeral 164 indicates a lever, which is joined to a movable member of the cylinder 163 in such a manner as to engage with one end of the claw 161.

The claw 161 is constantly biased by the tensile strength of the spring 162 in such a manner as to protrude into the transfer passage for the workpiece W, moving to clear the transfer passage for workpiece W only when the cylinder 163 operates to cause it to be pulled by the lever 164.

Numeral 165 indicates rollers, which are rotatably supported by the base 156 at fixed intervals and respectively attached to one end of each of a plurality of axles (not shown). Numeral 166 indicates sprockets, which are respectively attached to one end of each of the axles mentioned above. Numeral 167 indicates a motor, which is fixed to the base 156. Numeral 168 indicates a sprocket, which is attached to the motor 167. Numeral 169 indicates a chain, which is stretched between the sprockets 166 and 168.

Thus, when the motor 167 operates to rotate the rollers 165, any workpiece W placed on the rollers 165 is conveyed.

FIGS. 22 and 23 show the pin extractor F2. In the drawings, numeral 175 indicates a frame, which is arranged side by side with the frame 155. Numeral 176 indicates a mounting plate, which is fixed to the frame 175.

Numeral 177 indicates axles, which are rotatably supported by the mounting plate 176. Numeral 178 indicates rollers, which are respectively attached to one end of each axle 177. Numeral 179 indicates sprockets, which are respectively attached to one end of each axle 177. Numeral 180 indicates a motor, which is fixed to the frame 175. Numeral 181 indicates a sprocket, which is attached to the motor 180. Numeral 182 indicates a chain stretched between the sprockets 179 and 181.

When the motor 180 operates, the rollers 178 rotate to convey any workpiece W thereon.

Numeral 185 indicates a plate, which is fixed to the frame 175. Numeral 186 indicates a positioning plate, which has a V-shaped groove formed in its central portion and which is fixed to the plate 185. Numeral 187 indicates a clamp lever, which is rotatably supported by a bracket 188 fixed to the frame 175, through the intermediation of an axle 189. Numeral 190 indicates a cylinder, which is swingably supported by a bracket 191 fixed to the frame 175, through the intermediation of an axle 192. Numeral 193 indicates a joint, which is attached to one end of the cylinder 190 and rotatably linked with one end of the clamp lever 187 through the intermediation of a pin 194.

When a workpiece W is transferred onto the plate 185 by the rollers 178 until one of the reference pins P press-fitted into the workpiece W is inserted into the groove of the positioning plate 186, the cylinder 190 operates to rotate the clamp lever 187, which presses the reference pin P against the groove, thus positioning the reference pin P.

Numeral 195 indicates a receptacle, which is placed on the frame 175. Numeral 196 indicates a pipe, which is supported by the frame 175 in such a manner that one end thereof is opposed to the groove of the positioning plate 186, with the other end being opposed to the receptacle 195.

The reference pins P extracted from the workpieces W are received by the pipe 196 and collected in the receptacle 195.

Numeral 200 indicates a strut, which is fixed to the plate 185. Numeral 201 indicates a beam, which is fixed to the strut 200. Numeral 202 indicates a plate, which is attached to the beam 201. Numeral 203 indicates a linear guide device, which is supported by the plate 202. Numeral 204 indicates a bracket, which is attached to the beam 201.

Numeral 205 indicates a cylinder, which is fixed to the bracket 204. Numeral 206 indicates a slider, which is attached to a movable member of the linear guide device 203 and secured to a movable member of the cylinder 205 through the intermediation of a joint 207. Numeral 208 indicates a pin-extraction rod, which is fixed to the slider 206 in such a manner as to be fitted into the groove of the positioning plate 186 and as to face the positioned reference pin P. Numeral 209 indicates a rigid plate, which is attached to the slider 206. Numeral 210 indicates guide bars, which are slidably supported by the rigid plate 209. Numeral 211 indicates springs, which are fitted onto the guide bars 210. Numeral 212 indicates a presser plate, which is fixed to the guide bars 210.

When the positioning of a reference pin P has been effected by the positioning plate 186 and the clamp lever 187, the cylinder 205 operates to lower the slider 206, when the presser plate 212 comes into contact with the workpiece W; when the slider 206 further descends, the springs 211 are compressed, pressing the presser plate 212 against the workpiece W with their resiliency. At the same time, the rod 208 pushes the reference pin P out of the workpiece W.

FIGS. 24 to 28 show the second collecting device F3; in the drawings, numeral 220 indicate a frame, which is arranged side by side with the frame 186.

Numeral 221 indicates guides, which are fixed to the frame 220. Numeral 222 indicates sliders, which are slidably supported by the guides 221. Numeral 223 indicates a cylinder, which is fixed to a beam 224 secured to the frame 220. Numeral 225 indicates a plate, which is attached to the sliders 222 and a movable member of the cylinder 223. Numeral 226 indicates a lifter, which is secured to the plate 225 through the intermediation of supports 227.

When a workpiece W has been supplied by means of the rollers 178, the cylinder 223 operates to raise the lifter 226, by means of which the workpiece W is lifted from the rollers 178.

Numeral 230 indicates struts, and numeral 231 indicates girders, which are supported by the struts 200 and 230 through the intermediation of beams 232. Numeral 233 indicates linear guide devices, which are supported by the lower surfaces of the girders 231. Numeral 234 indicates a support, which is attached to the upper surfaces of the girders 231. Numeral 235 indicates a bracket, which is fixed to the support 234. Numeral 236 indicates a motor, which is secured to the bracket 235. Numeral 237 indicates a pinion, which is fixed to the motor 236. Numeral 238 indicates a plate, which is attached to movable members of the linear guide deices 233. Numeral 239 indicates a rack, which is secured to the plate 238 in such a manner as to engage the pinion 237.

Thus, when the motor 236 operates, the plate 238 moves along the linear guide devices 233.

Numeral 240 indicates a plate, which is secured to the plate 238 through the intermediation of supports 241. Numeral 242 indicates motor, which is secured to the plate 240. Numeral 243 indicates a gear, which is fixed to the motor 242. Numeral 244 indicates a shaft, which is rotatably supported by the plate 240 through the intermediation of bearings 245. Numeral 246 indicates a shaft, which is rotatably supported by the plate 240 through the intermediation of bearings 247. Numeral 248 indicates a gear, which is attached to one end of the shaft 244 in such a manner as to be in mesh with the gear 243. Numeral 249 indicates a gear, which is attached to one end of the shaft 244. Numeral 250 indicates a gear, which is attached to one end of the shaft 246 in such a manner as to be in mesh with the gear 249. Numeral 251 indicates a pulley, which is attached to the shaft 244. Numeral 252 indicates a pulley, which is attached to the shaft 246. Numeral 255 indicates a shaft, which is rotatably supported by the plate 240 through the intermediation of bearings (not shown). Numerals 257 and 258 indicate belts, which are respectively stretched between the pulleys 251 and 254 and between the pulleys 252 and 256. Numeral 260 indicates linear guide devices, which are supported by the plate 240. Numeral 261 indicates chucks, which have claws 262 at their lower ends and which are fixed to movable members of the linear guide devices 260 and are respectively joined to the timing belts 257 and 258.

When the motor 242 operates, the shafts 244 and 246 rotate in opposite directions, causing the timing belts 257 and 258 to run in opposite directions. Accordingly, the chucks 261, respectively connected with the timing belts 257 and 258, move along the linear guide devices 260, towards or away from each other.

Numeral 264 indicates guide pins, which are slidably supported by the chucks 261. Numeral 265 indicates springs, which are fitted onto the guide pins 264. Numeral 266 indicates detection plates, which are respectively attached to one end of each guide pin 264. Numeral 267 indicate detectors, which consist, for example, of proximity switches, and are fixed to the chucks 261 in such a manner as to face the path for the detection plates 266.

When the chucks 261 take hold of a workpiece W, the detection plates 266 abut against the workpiece W, and make a relative movement with respect to the chucks 261 against the resilience of the springs 265, until they reach positions where they face the detectors 267, which emit a signal indicating that the workpiece W has been grasped.

Numeral 270 indicates a motor, which is fastened to one of the struts 230 through the intermediation of a bracket 271. Numeral 272 indicates a timing pulley, which is fixed to the motor 270. Numerals 273 and 274 indicate bearings, which are fixed between the frame 220 and one of the struts 230 at a predetermined interval. Numeral 275 indicates a feed screw, which is rotatably supported by the bearings 273 and 274. Numeral 276 indicates a timing pulley, which is attached to the lower end of the feed screw 275. Numeral 277 indicates a timing belt, which is stretched between the timing pulleys 272 and 276. Numeral 278 indicates a nut, which is threadedly engaged with the feed screw 275. Numeral 279 indicates a comb-shaped lifter, which is secured to the nut 278. Numeral 280 indicates a plate, which has a hole 281 in its central portion and which is placed on the lifter 279.

Each time a workpiece W is placed on the lifter 279, the motor 270 operates to lower the lifter 270 through a distance corresponding to the thickness of the workpiece W.

Numeral 282 indicates a stopper, which is secured to the bearing 274 through the intermediation of a bracket 283.

Numeral 285 indicates a carriage, which has a groove for the lifter 279 to be fitted in and which is equipped with a positioning pin 286 to be fitted into the hole 281 of the plate 280. Numeral 287 indicates wheels, which are mounted on the lower surface of the carriage 285 through the intermediation of bearings 288. Numeral 289 indicates a handle, which is fixed to the carriage 285.

Numeral 290 indicates positioning guides, which are fixed to the frame 220.

In the above construction, a signal indicative of the requirement for the supply of a workpiece W is transmitted from a printed circuit board processing machine A immediately before the termination of the processing of a workpiece W in that printed processing machine A (with such a timing as will provide enough time for a workpiece W to be extracted from the feeder E and reach the loading/unloading device D associated with that printed circuit board processing machine A).

Upon receiving the request, the feeder E operates the cylinder 121, causing the chuck 124 to move to the side of the stocker E1; when, at the end of the movement, the claws 125 face a workpiece W, the cylinder of the chuck 124 operates to close the claws 125, thereby taking hold of the workpiece W. Then, the cylinder 121 operates to move one end of the workpiece W until it comes to a position between the roller 115 at an extremity and the roller 132. Then, the cylinder of the chuck 124 operates to open the claws 125 so as to release the workpiece W; afterwards, the cylinder 121 operates again to bring the chuck 124 back to its standby position.

Then, the motor 66 operates to move the chains 87 and 88, transferring the workpiece W extracted by the chuck 124 to a position where it is in contact with the roller 115 at an extremity. Then, the motor 116 operates to rotate the rollers 115; at the same time, the roller 132 is lowered to press the workpiece W against the roller 115 at an extremity. The workpiece W is then extracted from the stocker E1 by the rotation of the rollers 115 and transferred onto the tipping arm 135.

When the workpiece W abuts against the stopper 139, the motor 116 stops, stopping the rotation of the rollers 115. At the same time, the motor 38 of the first conveying device C1 operates to rotate the rollers 36. In this condition, the cylinder 137 operates to rotate the tipping arm 135 to cause the workpiece W to stand on end, placing it on the rollers 36. Then, the workpiece W is transferred by the rotation of the rollers 36 to the printed circuit board processing machine A which has required the supply thereof.

Meanwhile, in the stocker E1 of the feeder E, the air-cylinder 95 operates to push a pallet 91 having a workpiece W thereon with the claw 96, moving it to the side of the chain 87. At the same time, the air-cylinder 98 operates to push a vacant pallet 91 on the side of the chain 87 with the claw 99, moving it to the side of the chain 88.

When supplying workpieces W to the stocker E1, they are fed onto those pallets 91 which are on the side of the chain 88.

The respective conveying devices C allocated to the printed circuit board processing machines A operate their motors 38, starting from the one situated nearest to the feeder E, each transferring the supplied workpiece W to the next conveying device C. In the conveying device C associated with that printed circuit board processing machine A which has required the supply of a workpiece W, the cylinder 45 is operated to cause the stopper 46 to protrude into the moving path for the reference pins P.

When the workpiece W has been supplied to the conveying device C associated with that printed circuit board processing machine A which has required the supply of a workpiece W, and one of the reference pins P abuts against the stopper 46, the motor 38 of this conveying device C is stopped, when the cylinder 45 operates to bring the stopper 46 to its standby position. At the same time, the cylinders 42 operate to push the workpiece W upwards, lifting it from the rollers 36.

When the processing of the workpiece W by the printed circuit board processing machine A has been finished, the motor 2 of the printed circuit board processing machine A operates to bring the table 4 to a position above the second conveying device C2, when the air-cylinder 52 of the second loading/unloading device D2 operates to bring the lifter 53 to the workpiece delivery position. Then, the cylinder 22 of the tipping device B operates to rotate the tipping arm 20, thereby causing the workpiece W to stand on end. In this condition, the cylinder 25 operates to rotate the claw 23. This results in the workpiece W losing its support, so that it slides off along the tipping arm 20 to be supported by the lifter 53. When the workpiece W has been transferred to the lifter 53, the air-cylinder 52 operates to cause the lifter 53 to descend to its standby position, when the workpiece W also descends toward the conveying device C2. At this time, the cylinders 42 of the conveying device C2 operate to support the workpiece W immediately before it comes into contact with the rollers 36. At the same time, the motor 38 operates to rotate the rollers 36. And when the rollers 36 rotate, the cylinders 42 operate to place the workpiece W onto the rollers 36. Then, the workpiece W is transferred by the rotation of the rollers 36 toward the collecting device F.

On the other hand, when, in the printed circuit board processing machine A, the lifter 53 on the side of the conveying device C2 descends, the motor 2 operates with the workpiece W having been discharged, moving the table 4 to a position above the conveying device C1.

Then, the air-cylinder 52 on the side of the conveying device C1 operates to raise the lifter 53 toward the delivery position. As it ascends, the lifter 53 holds the workpiece W being supported by the cylinders 42 of the conveying device C1, and raises the workpiece W to the delivery position. When the workpiece W has reached the delivery position, the cylinder 25 of the tipping device B works to operate the lever 26 and rotate the claw 23 with the resiliency of the spring 24, causing the workpiece W to be supported by this claw 23 at the delivery position. Then, the air-cylinder 52 operates to cause the lifter 53 to descend to the standby position.

In the tipping device B, on the other hand, the cylinder 22 operates to pull the tipping arm 20 down to the side of the table, placing the workpiece W on the table 4.

At the same time, the motor 2 of the printed circuit board processing machine A operates to move the table 4 to the side of the column 5, bringing the mark M provided on the workpiece W to the detecting position for the detector G. When the detector G has detected the mark M, a detection signal indicative of the detection is supplied to the associated controller H.

The controller H discriminates the type of workpiece W in accordance with the signal supplied from the detector G and checks whether the processing conditions and processing programs are registered therein; if they are not registered, it requires the requisite processing conditions and processing programs of the external memory J. Upon any such request, the external memory J supplies the requested processing conditions and processing programs to the controller H which has requested them.

The controller H registers the processing conditions and processing programs provided therein or supplied from the external memory J on the execution area of a built-in memory, and starts the processing of the workpiece W while controlling the associated printed circuit board processing machine A in accordance with the processing conditions and the processing programs.

On the other hand, the workpiece W which has been conveyed to the collecting device F by the conveying device C2 is stopped where the stopper 46 abuts against one of the reference pins P, and lifted from the rollers 36 by the cylinders 42. Then, the air cylinder 152 operates to raise the lifter 153 to the delivery position for workpieces W. As it descends, the lifter 153 holds the workpiece W being supported by the cylinders 42 of the conveying device C2, raising the workpiece to the delivery position, where the tipping arm 157 is on standby with its tipping arm 157 standing on end. When the workpiece W has reached the delivery position, the cylinder 163 operates to cause the claw 161 to rotate due to the resiliency of the spring 162, the workpiece W being supported by the claw 161. Then, the air-cylinder 152 operates to cause the lifter 153 to descend to the standby position. At the same time, the motor 167 operates to rotate the rollers 165. Then, the cylinder 159 operates to pull the tipping arm 157 down, causing the workpiece W to be placed on the rollers 165. Then, the work W is transferred by the rotation of the rollers 165 to the pin extractor F2.

When the workpiece W has been transferred to the pin extractor F2, the reference pin P of the workpiece W is fed by the rollers 178 rotating by the operation of motor 180 until it abuts against the groove of the positioning plate 186. Then, the cylinder 190 operates to rotate the clamp lever 187, and the positioning of one of the reference pins P is effected, with the reference pin P being pressed against the groove by the clamp lever 187. At the same time, the motor 180 stops.

The cylinder 205 operates to lower the rod 208, when the lower end of the rod 208 abuts against the reference pin P and, at the same time, the presser plate 212 abuts against the workpiece W. When the rod 208 is further lowered, the rod 208 pushes the reference pin P downwards, causing it to protrude beyond the workpiece W. At this time, the presser plate 212 lies on the workpiece W and is prevented from moving, so that the rigid plate 209 and the guide bars 210 make a relative movement such as to compress the springs 21. Then, a resilient force corresponding to the compression of the springs 211 is applied to presser plate 212, thus causing it to be pressed against the workpiece W by the resilient force of the springs 211.

Further, the rod 208 descends, and the reference pin P is pushed off between the positioning plate 186 and the clamp lever 187 into the pipe 196, and received by the receptacle 195.

When the reference pin P has been extracted, the cylinder 205 operates to raise the rod 208. At the same time, the cylinder 190 operates to rotate the clamp lever 187 to the standby position. Further, the motor 180 operates to feed the workpiece W until the reference pin P on the rear-end side of the workpiece W abuts against the groove of the positioning plate 186.

And, in the same manner as described above, the reference pin P on the rear-end side of the workpiece W is extracted.

When the reference pins P of the workpiece W have been extracted, the motor 180 operates to rotate the rollers 178, bringing the workpiece W to a position above the lifter 226. When the workpiece W has been fed to a predetermined position, the motor 180 stops.

When the workpiece W has been supplied, the cylinder 223 operates to raise the lifter 226, causing the workpiece W to be lifted above the rollers 178.

Then, the motor 242 operates to move the chuck 261 from the standby position to the holding position thereof. If, at this time, the detection plates 266 abut against the workpiece W, a relative movement occurs between the chucks 261 and the detection plates 266 since the detection plates 266 are restricted in their movement by the workpiece W. And, when, due to this relative movement, the detection plates 266 are detected by the detectors 267, the motor 242 stops.

Then, the motor 236 operates to move the chucks 261 holding the workpiece W to the side of the lifter 279. And, at the end of this movement, the motor 236 stops. Then, the motor 242 operates to bring the chucks 261 to the standby position thereof. At this time, the detection plate 266 are being pressed against the workpiece W by the resilient force of the springs 265, so that the workpiece W is released from the chucks 261 on the spot, and is dropped onto the lifter 279.

When, on the other hand, the workpiece W is grasped by the chucks 261, the cylinder 223 operates, and the lifter 226 descends to the standby position. Further, when the workpiece W is released from the chucks 261, the motor 236 operates to bring the chucks 261 back to the standby position above the lifter 226.

Further, when the workpiece W is dropped onto the lifter 279, the motor 270 operates to cause the lifter 279 to descend a distance corresponding to the thickness of the workpiece W dropped.

In this way, workpieces W are successively stacked on the lifter 279. And when the lifter 279 has descended into the groove of the carriage 285, the pin 286 is fitted into the hole 281 of the plate 280. At the same time, the workpieces W stacked on the lifter 279 are placed on the carriage 285.

When it has been loaded with the workpieces W, the carriage 285 is drawn out, and, after having placed the plate 280 on the lifter 279, the motor 270 is operated so as to raise the lifter 279. Then, a vacant carriage 285 is let in along the guides 290 until it abuts against the stopper 282.

To perform the supply of workpieces W more efficiently, it is possible in the above embodiment to provide, as shown in FIG. 8, each first conveying device C1, constituting the feeding path for the workpieces W, with cylinders 41 and 43 and a stopper 44, conveying each workpiece W to a position where it abuts against the stopper 44 and raising it by the cylinders 41 to set it in a standby condition.

Further, it is possible to provide the external memory J with an input device and a processor, thus forming a main control unit.

INDUSTRIAL APPLICABILITY

As stated above, in accordance with this invention, it is possible to individually operate each of a plurality of printed circuit board processing machines arranged side by side, thereby making it possible to produce limited kinds of printed circuit boards in small quantities at a high level of efficiency.

We claim:

1. A printed circuit board processing apparatus comprising:
a plurality of printed circuit board processing machines arranged side by side, in each of which a printed circuit board placed on a table and a tool held by a single spindle are caused to make a relative movement in X-, Y- and Z-directions of the machine to process the printed circuit board; tipping devices respectively mounted on said tables such as to be swingable and adapted to perform the delivery of printed circuit boards to and from said tables; conveying devices arranged along the beds of said printed circuit board processing machines and each equipped with a feeding path and a discharging path which are adapted to convey printed circuit boards in an inclined posture; loading/unloading devices each arranged at a delivery position on the printed-circuit-board-processing-machine side of the feeding and discharging paths of each conveying device and adapted to effect the delivery of printed circuit boards in said inclined posture between said tipping device and said feeding and discharging paths; a printed-circuit-board feeder connected to one end of each feeding path; a printed circuit board collecting device connected to one end of each discharging path; and detectors allocated to the respective spindles of said printed circuit board processing machines and each adapted to read the kind of a printed circuit board fed onto the table.

2. A printed circuit board processing apparatus, according to claim 1, wherein said tipping devices comprise lattice-shaped tipping arms which are rotatably supported at one end of the table through the intermediation of an axle.

3. A printed circuit board processing apparatus, according to claim 2, wherein said tipping devices further comprise a cylinder rotatably connected to one end of each of said tipping arms and rotatably connected at the other end to the table, whereby said tipping arms are actuated by said cylinder.

4. A printed circuit board processing apparatus, according to claim 3, wherein said tipping arms are configured to fit into a groove formed in the upper surface of the table.

5. A printed circuit board processing apparatus, according to claim 1, wherein each of said conveying devices comprise:
- a base;
- a rail secured to the base;
- a plurality of support bars orthogonally secured to the rail at fixed intervals;
- a plurality of guides secured orthogonally to the support bars at fixed intervals;
- axles having sprockets on the end arranged at fixed intervals and rotatably supported by said rail;
- rollers fixed on one end of each axle;
- a motor, attached to the rail, having a sprocket; and
- a chain connected to the motor sprocket and to the axle sprockets, whereby rotation of the motor causes rotation of the sprockets which turn the axles to thereby convey the printed circuit board.

6. A printed circuit board processing apparatus, according to claim 1, wherein each of said loading/unloading devices comprise:
- a base that also serves a base for one of said conveying devices;
- a frame secured to the base;
- linear guide device fixed between the frame and a rail of one of said conveying devices;
- a rod less air-type cylinder fixed between said rail and said frame parallel to said linear guide device; and
- a lifter which is movably supported by the linear guide device and connected with a movable member of the air-cylinder, whereby the lifter is raised or lowered according to operation of the air-cylinder.

* * * * *